(12) United States Patent
Nishizawa et al.

(10) Patent No.: US 12,088,277 B2
(45) Date of Patent: Sep. 10, 2024

(54) VIBRATION DEVICE AND OSCILLATOR

(71) Applicant: Seiko Epson Corporation, Toyko (JP)

(72) Inventors: Ryuta Nishizawa, Nagano (JP); Atsushi Matsuo, Shiojiri (JP); Keiichi Yamaguchi, Ina (JP); Taku Matsunaga, Minowa (JP)

(73) Assignee: SEIKO EPSON CORPORATION (JP)

( * ) Notice: Subject to any disclaimer, the term of this patent is extended or adjusted under 35 U.S.C. 154(b) by 780 days.

(21) Appl. No.: 17/322,948

(22) Filed: May 18, 2021

(65) Prior Publication Data
US 2021/0367583 A1 Nov. 25, 2021

(30) Foreign Application Priority Data

May 19, 2020 (JP) .................................. 2020-087260

(51) Int. Cl.
*H03H 9/19* (2006.01)
*G01K 7/32* (2006.01)
*H03B 5/32* (2006.01)

(52) U.S. Cl.
CPC ................ *H03H 9/19* (2013.01); *G01K 7/32* (2013.01); *H03B 5/32* (2013.01)

(58) Field of Classification Search
CPC ............. H03H 9/17; H03H 9/19; H10N 30/87
USPC ......................................... 310/361, 365, 366
See application file for complete search history.

(56) References Cited

U.S. PATENT DOCUMENTS

| 5,122,993 | A | * | 6/1992 | Hikita .................. B06B 1/0625 |
| | | | | 600/459 |
| 5,214,668 | A | | 5/1993 | Satou et al. |
| 5,319,324 | A | | 6/1994 | Satoh et al. |
| 2008/0122321 | A1 | * | 5/2008 | Iwasaki .................. H03H 9/566 |
| | | | | 310/366 |

FOREIGN PATENT DOCUMENTS

| JP | H04-363913 A | 12/1992 |
| JP | H06-021741 A | 1/1994 |
| JP | H09-018279 A | 1/1997 |
| JP | 2002-026658 A | 1/2002 |
| JP | 2009-232336 A | 10/2009 |
| JP | 2013-098841 A | 5/2013 |
| JP | 2013-197824 A | 9/2013 |
| JP | 2014-033368 A | 2/2014 |

* cited by examiner

*Primary Examiner* — Derek J Rosenau
(74) *Attorney, Agent, or Firm* — Harness, Dickey & Pierce, P.L.C.

(57) ABSTRACT

A vibration device includes a quartz substrate including a first vibration section, a second vibration section, and a third vibration section, a pair of first excitation electrodes formed at two principal surfaces of the quartz substrate, a pair of second excitation electrodes so formed as to sandwich the second vibration section in the thickness direction of the quartz substrate, and a pair of third excitation electrodes so formed as to sandwich the third vibration section in the thickness direction of the quartz substrate. At least one of the pair of second excitation electrodes is formed at a first inclining surface that inclines with respect to the two principal surfaces. At least one of the pair of third excitation electrodes is formed at a second inclining surface that inclines with respect to the two principal surfaces. The second inclining surface inclines with respect to the first inclining surface.

15 Claims, 15 Drawing Sheets

VIBRATION DEVICE AND OSCILLATOR

The present application is based on, and claims priority from JP Application Serial Number 2020-087260, filed May 19, 2020, the disclosure of which is hereby incorporated by reference herein in its entirety.

BACKGROUND

1. Technical Field

The present disclosure relates to a vibration device and an oscillator.

2. Related Art

To generate a frequency signal that is stable over a wide temperature range, a temperature compensated crystal oscillator (TCXO) including a temperature detection device and a temperature compensation circuit is widely used. However, a TCXO, in which the vibration device made of quartz and the temperature detection device are separately configured and the temperature detected by the temperature detection device and there is therefore a discrepancy due to a detection error between the temperature of the vibration device, has a difficulty performing temperature compensation with high precision.

To eliminate the difficulty, a vibration device in which a first vibration section for oscillation signal output and a second vibration section for temperature detection are provided on a common piezoelectric plate is disclosed, as shown in JP-A-2013-98841. Since the two vibration sections are formed on the common piezoelectric plate, heat transfer is quickly performed between the first and second vibration sections. Therefore, the detection error between the temperature detected by the second vibration section for temperature detection and the temperature of the first vibration section for oscillation signal output is smaller than the detection error when the vibration device and the temperature detection device are separately configured, whereby temperature compensation can be performed with higher precision.

In the vibration device described in JP-A-2013-98841, however, a vibration excitation electrode for oscillation signal output and a vibration excitation electrode for temperature detection are formed on surfaces of the piezoelectric plate that have been cut at the same cutting angle, and the first vibration section for oscillation signal output and the second vibration section for temperature detection have the same frequency-temperature characteristic. The first vibration section for oscillation signal output is cut at a cutting angle so set that a frequency change is small with respect to a temperature change, and the second vibration section for temperature detecting therefore also has a frequency-temperature characteristic providing a small frequency change with respect to a temperature change, resulting in low resolution of a temperature change with respect to a frequency change and hence a problem of imprecise temperature detection.

SUMMARY

A vibration device includes a quartz substrate including a first vibration section, a second vibration section, and a third vibration section, a pair of first excitation electrodes formed at two principal surfaces of the quartz substrate in the first vibration section, a pair of second excitation electrodes so formed in the second vibration section as to sandwich the second vibration section in a thickness direction of the quartz substrate, and a pair of third excitation electrodes so formed in the third vibration section as to sandwich the third vibration section in the thickness direction of the quartz substrate. At least one of the pair of second excitation electrodes is formed at a first inclining surface that inclines with respect to the two principal surfaces. At least one of the pair of third excitation electrodes is formed at a second inclining surface that inclines with respect to the two principal surfaces. The second inclining surface inclines with respect to the first inclining surface.

An oscillator includes the vibration device described above, a first oscillation circuit that is electrically coupled to the first excitation electrodes and outputs a first oscillation signal, a second oscillation circuit that is electrically coupled to the second excitation electrodes and outputs a second oscillation signal, a third oscillation circuit that is electrically coupled to the third excitation electrodes and outputs a third oscillation signal, and a control signal output circuit to which at least one of the second oscillation signal and the third oscillation signal is inputted and which outputs a control signal that controls an oscillation frequency of the first oscillation signal based on the inputted signal.

DESCRIPTION OF EXEMPLARY EMBODIMENTS

1. First Embodiment

A schematic configuration of a vibration device 1 according to a first embodiment will be described with reference to FIGS. 1 and 2.

Figure 1:
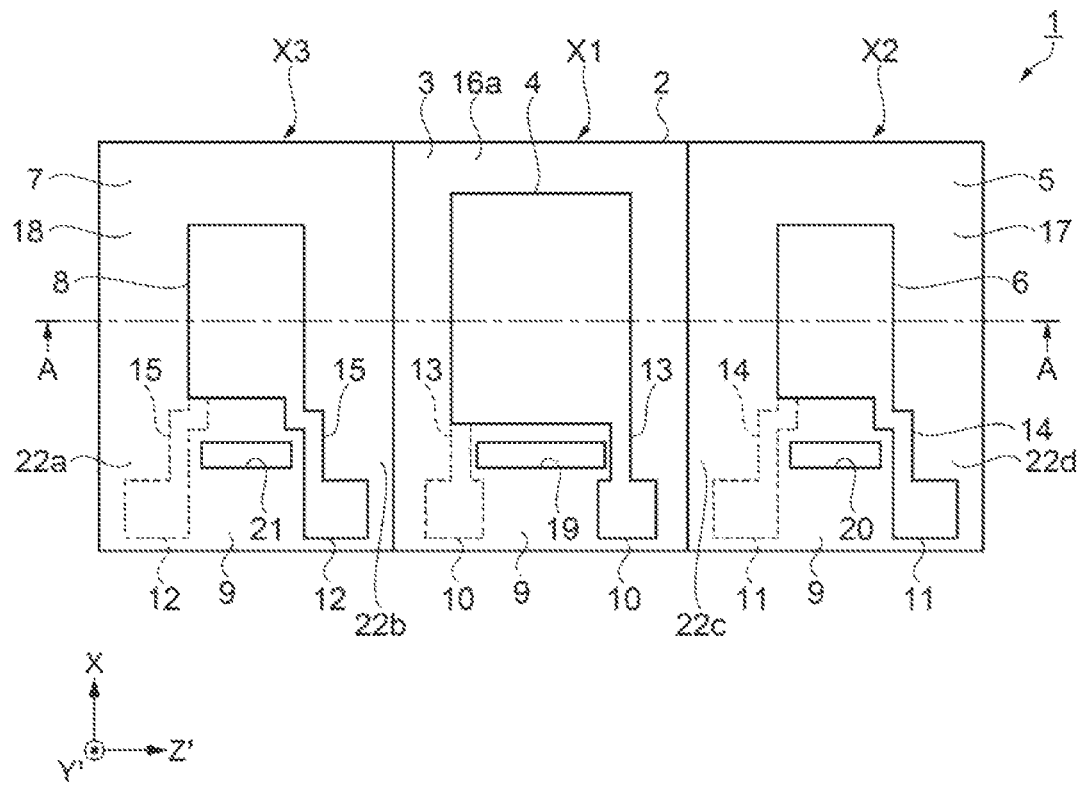
FIG. 1 is a plan view showing a vibration device according to a first embodiment.
Figure 2:
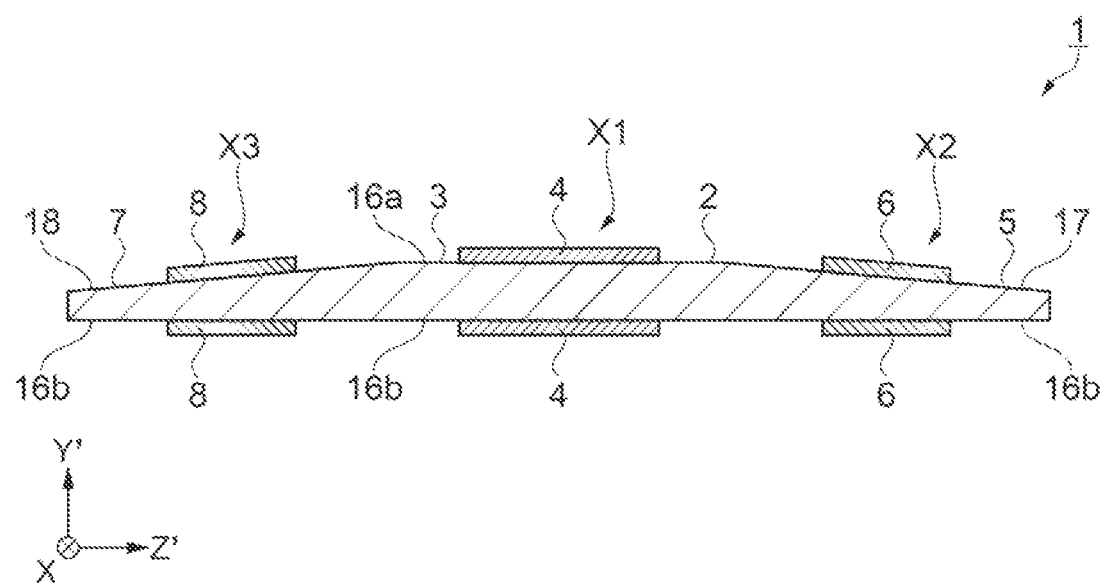
FIG. 2 is a cross-sectional view taken along the line A-A in FIG. 1.

Out of axes X, Y, and Z perpendicular to one another, axes Y' and Z' in FIGS. 1 and 2 are the axes Y and Z rotated around the axis X by a predetermined angle.

The vibration device 1 according to the first embodiment includes a quartz substrate 2, first excitation electrodes 4, which are formed at a first vibration section 3, second excitation electrodes 6, which are formed at a second vibration section 4, third excitation electrodes 8, which are formed at a third vibration section 7, terminals 10, 11, and 12, which are formed at fixing sections 9, lead electrodes 13, which couple the first excitation electrodes 4 to the terminals 10 in an electrically conductive manner, lead electrodes 14, which couple the second excitation electrodes 6 to the terminals 11 in an electrically conductive manner, and lead electrodes 15, which couple the third excitation electrodes 8 to the terminals 12 in an electrically conductive manner.

The vibration device 1 includes a first vibration device X1, a second vibration device X2, and a third vibration device X3. The first vibration device X1 includes the first vibration section 3, at which a pair of first excitation electrodes 4 are formed. The second vibration device X2 includes the second vibration section 5, at which a pair of second excitation electrodes 6 are formed. The third vibration device X3 includes the third vibration section 7, at which a pair of third excitation electrodes 8 are formed. The first vibration device X1, the second vibration device X2, and the third vibration device X3 share the quartz substrate 2 and therefore each have a structure that is likely to allow external heat to be uniformly transferred among them.

The quartz substrate 2 includes the first vibration section 3, the second vibration section 5, the third vibration section 7, and the fixing sections 9, which fix the quartz substrate 2 to a package that is not shown. The quartz substrate 2 is a flat plate so configured that the surface XZ' is a principal surface and the direction along the axis Y' is the thickness direction.

The first vibration section 3, the second vibration section 5, and the third vibration section 7 are juxtaposed with each other in the direction along the axis Z' and arranged in the order of the third vibration section 7, the first vibration section 3, and the second vibration section 5 toward the positive side of the axis Z'. The fixing sections 9 are so disposed as to be shifted in the direction along the axis X, which is perpendicular to the axis Z', from the first vibration section 3, the second vibration section 5, the third vibration section 7.

The first vibration section 3 has a first principal surface 16a and a second principal surface 16b of the quartz substrate 2, and the second principal surface 16b is parallel to the first principal surface 16a. The pair of first excitation electrodes 4 are so formed on the first principal surface 16a and the second principal surface 16b of the first vibration section 3 as to sandwich the first vibration section 3 in the thickness direction of the quartz substrate 2. The first excitation electrode 4 on the first principal surface 16a and the first excitation electrode 4 on the second principal surface 16b are so disposed as to coincide with each other in the plan view in the direction along the axis Y'. The first principal surface 16a and the second principal surface 16b correspond to two principal surfaces.

The second vibration section 5 has a first inclining surface 17 and the second principal surface 16b of the quartz substrate 2. The pair of second excitation electrodes 6 are so formed on the first inclining surface 17 and the second principal surface 16b of the second vibration section 5 as to sandwich the second vibration section 5 in the thickness direction of the quartz substrate 2. The second excitation electrode 6 on the first inclining surface 17 and the second excitation electrode 6 on the second principal surface 16b are so disposed as to coincide with each other in the plan view in the direction along the axis Y'.

The first inclining surface 17 is an inclining surface that inclines by a predetermined inclination angle with respect to the first principal surface 16a, and the first inclining surface 17 inclines in the first embodiment in such a way that the thickness of the second vibration section 5 decreases as the distance from the first vibration section 3 increases.

The third vibration section 7 has a second inclining surface 18 and the second principal surface 16b of the quartz substrate 2. The pair of third excitation electrodes 8 are so formed on the second inclining surface 18 and the second principal surface 16b of the third vibration section 7 as to sandwich the third vibration section 7 in the thickness direction of the quartz substrate 2. The third excitation electrode 8 on the second inclining surface 18 and the third excitation electrode 8 on the second principal surface 16b are so disposed as to coincide with each other in the plan view in the direction along the axis Y'.

The second inclining surface 18 is an inclining surface that inclines by a predetermined inclination angle with respect to the first principal surface 16a, and the second inclining surface 18 inclines in the first embodiment in such a way that the thickness of the third vibration section 7 decreases as the distance from the first vibration section 3 increases.

The first vibration device X1 includes the first vibration section 3, the first excitation electrodes 4, which are formed at the first vibration section 3, the terminals 10, which are formed at the fixing section 9, and the lead electrodes 13, which couple the first excitation electrodes 4 to the terminals 10 in an electrically conductive manner.

On the first principal surface 16a of the first vibration device X1 are formed the first excitation electrode 4, the terminal 10, which electrically couples the first vibration device X1 to an oscillation circuit that is not shown, and the lead electrode 13, which electrically couples the first excitation electrode 4 to the terminal 10. Further, on the second principal surface 16b of the first vibration device X1 are formed the first excitation electrode 4, the terminal 10, which electrically couples the first vibration device X1 to the oscillation circuit that is not shown, and the lead electrode 13, which electrically couples the first excitation electrode 4 to the terminal 10.

The second vibration device X2 includes the second vibration section 5, the second excitation electrodes 6, which are formed at the second vibration section 5, the terminals 11, which are formed at the fixing section 9, and the lead electrodes 14, which couple the second excitation electrodes 6 to the terminals 11 in an electrically conductive manner.

On the first inclining surface 17 of the second vibration device X2 are formed the second excitation electrode 6, the terminal 11, which electrically couples the second vibration device X2 to the oscillation circuit that is not shown, and the lead electrode 14, which electrically couples the second excitation electrode 6 to the terminal 11. Further, on the second principal surface 16b of the second vibration device X2 are formed the second excitation electrode 6, the terminal 11, which electrically couples the second vibration device X2 to the oscillation circuit that is not shown, and the lead electrode 14, which electrically couples the second excitation electrode 6 to the terminal 11.

The third vibration device X3 includes the third vibration section 7, the third excitation electrodes 8, which are formed at the third vibration section 7, the terminals 12, which are formed at the fixing section 9, and the lead electrodes 15, which couple the third excitation electrodes 8 to the terminals 12 in an electrically conductive manner.

On the second inclining surface 18 of the third vibration device X3 are formed the third excitation electrode 8, the terminal 12, which electrically couples the third vibration device X3 to the oscillation circuit that is not shown, and the lead electrode 15, which electrically couples the third excitation electrode 8 to the terminal 12. Further, on the second principal surface 16b of the third vibration device X3 are formed the third excitation electrode 8, the terminal 12, which electrically couples the third vibration device X3 to the oscillation circuit that is not shown, and the lead electrode 15, which electrically couples the third excitation electrode 8 to the terminal 12.

Since the first vibration device X1 has the pair of first excitation electrodes 4 formed on the two principal surfaces 16a and 16b of the first vibration section 3, applying voltage to the terminals 10 allows the first vibration section 3 to vibrate.

Since the second vibration device X2 has the pair of second excitation electrodes 6 so formed on the first inclining surface 17 and the second principal surface 16b of the second vibration section 5 as to sandwich the second vibration device X2 in the thickness direction of the quartz substrate 2, applying voltage to the terminals 11 allows the second vibration section 5 to vibrate.

Since the third vibration device X3 has the pair of third excitation electrodes 8 so formed on the second inclining surface 18 and the second principal surface 16b of the third vibration section 7 as to sandwich the third vibration device X3 in the thickness direction of the quartz substrate 2, applying voltage to the terminals 12 allows the third vibration section 7 to vibrate.

A first through hole 19, a second through hole 20, and a third through hole 21 are provided between the first vibration section 3 and the fixing section 9, between the second vibration section 5 and the fixing section 9, and between the third vibration section 7 and the fixing section 9, respectively. Providing the first through hole 19, the second through hole 20, and the third through hole 21 allows suppression of transmission of stress induced when the vibration device 1 is fixed to the package, which is not shown, via a bonding member, such as an adhesive or bumps, from the fixing sections 9 to the first vibration section 3, the second vibration section 5, and the third vibration section 7.

Small-width sections 22a, 22b, 22c, and 22d are provided between the first vibration section 3 and the fixing section 9, between the second vibration section 5 and the fixing section 9, and between the third vibration section 7 and the fixing section 9, respectively. The small-width sections are portions of the quartz substrate 2 that are the portion that couples the first vibration section 3 to the fixing section 9, the portion that couples the second vibration section 5 to the fixing section 9, and the portion that couples the third vibration section 7 to the fixing section 9 and each have a length in the direction along the axis Z' shorter than the overall length of the quartz substrate 2 in the direction along the axis Z'. Providing the small-width sections 22a, 22b, 22c, and 22d allows suppression of transmission of the stress induced when the vibration device 1 is fixed to the package, which is not shown, via the bonding member, such as an adhesive or bumps, from the fixing sections to the first vibration section 3, the second vibration section 5, and the third vibration section 7.

In the first embodiment, the small-width sections 22a, 22b, 22c, and 22d are formed by providing the first through hole 19, the second through hole 20, and the third through hole 21, but not necessarily, and may instead be formed by providing the quartz substrate 2 with cutouts formed by cutting in the direction along the axis Z' part of edges of the quartz substrate 2 that are the edges parallel to the direction along the axis X in the plan view in the direction along the axis Y'.

The cutting angle of the quartz substrate 2 in the present embodiment will next be described with reference to FIG. 3.

Figure 3:
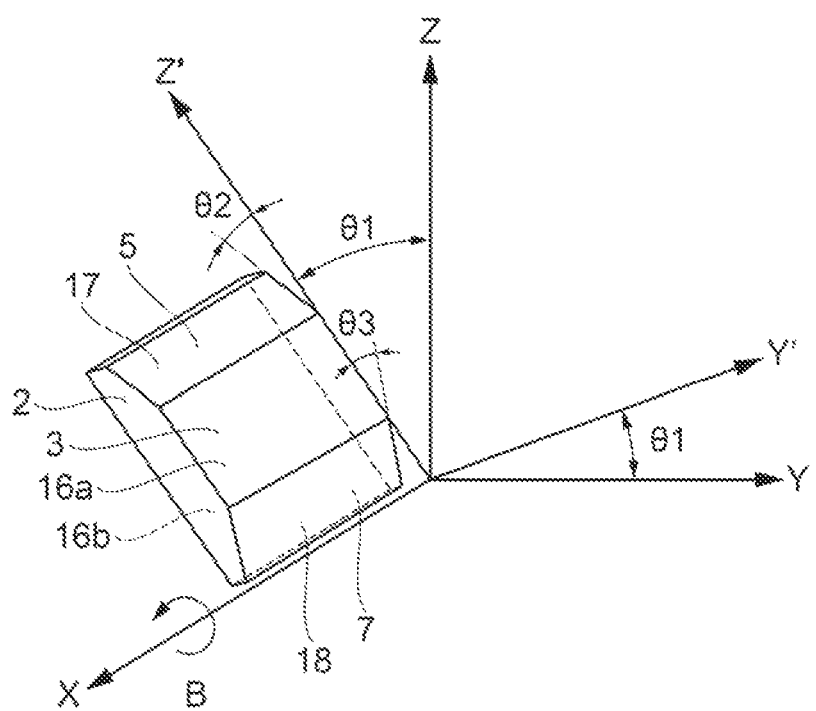
FIG. 3 shows the cutting angle of a quartz substrate.

A piezoelectric material, such as quartz, belongs to a trigonal system and has crystal axes X, Y, and Z perpendicular to one another, as shown in FIG. 3. The axes X, Y, and Z are called an electrical axis, a mechanical axis, and an optical axis, respectively.

For example, as the piezoelectric substrate, a flat plate formed of what is called a rotated-Y-cut quartz substrate, which is produced by cutting a quartz block along a rotated plane XZ rotated around the axis X by a predetermined angle $\theta 1$, is used as the quartz substrate 2. The angle $\theta 1$ is also called a cutting angle of the rotated-Y-cut quartz substrate.

The rotation direction in which the plane XZ is rotated around the axis X is indicated by the arrow B; the counterclockwise rotation when viewed from the positive side of the axis X, which is the axis of rotation, is called a positive rotation, and the clockwise rotation is called a negative rotation.

Assuming that the axis Y' is a coordinate axis that is the rotated axis Y rotated by the angle $\theta 1$ around the axis X and the axis Z' is a coordinate axis that is the rotated axis Z rotated by the angle $\theta 1$ around the axis X, the rotated-Y-cut quartz substrate can be expressed by crystal axes X, Y', and Z' perpendicular to one another. The rotated-Y-cut quartz substrate has a thickness direction along the axis Y' and has a principal surface that is the plane XZ' containing the axes X and Z' perpendicular to the axis Y', and a thickness slip vibration is excited as primary vibration at the principal surface.

A rotated-Y-cut quartz substrate having an angle $\theta 1$ of about 35° 15' is called an AT-cut quartz substrate and has an excellent frequency-temperature characteristic. The following description of the present embodiment will be made by using the AT-cut quartz substrate as an example of the quartz substrate 2, but not necessarily, and the quartz substrate 2 may be, for example, a BT-cut quartz substrate that allows excitation of thickness slip vibration. When the AT-cut quartz substrate is used as the quartz substrate 2, the angle θ1 may be about 35° 15' or may instead, for example, be 35° 17'.

In the present embodiment, the angle θ1 of the quartz substrate 2 is 35° 15'. The cutting angle of the two principal surfaces 16a and 16b of the quartz substrate 2 is therefore θ1, that is, 35° 15'.

The first inclining surface 17 of the quartz substrate 2 inclines by an angle θ2 with respect to the first principal surface 16a. That is, since the first inclining surface 17 of the quartz substrate 2 is rotated from the axis Z' in the positive direction around the axis X, the cutting angle of the first inclining surface 17 is θ1+θ2, that is, 35° 15'+θ2.

The second inclining surface 18 of the quartz substrate 2 inclines by an angle θ3 with respect to the first principal surface 16a. That is, since the second inclining surface 18 of the quartz substrate 2 is rotated from the axis Z' in the negative direction around the axis X, the cutting angle of the second inclining surface 18 is θ1−θ3, that is, 35° 15'−θ3.

In the present embodiment, the cutting angle of the first inclining surface 17 is θ1+θ2, and the cutting angle of the second inclining surface 18 is θ1−θ3, so that the cutting angle of the first inclining surface 17 differs from the cutting angle of the second inclining surface 18.

The state in which the cutting angle of the first inclining surface 17 differs from the cutting angle of the second inclining surface 18 also refers to a state in which the second inclining surface 18 inclines with respect to the first inclining surface 17.

Figure 4:
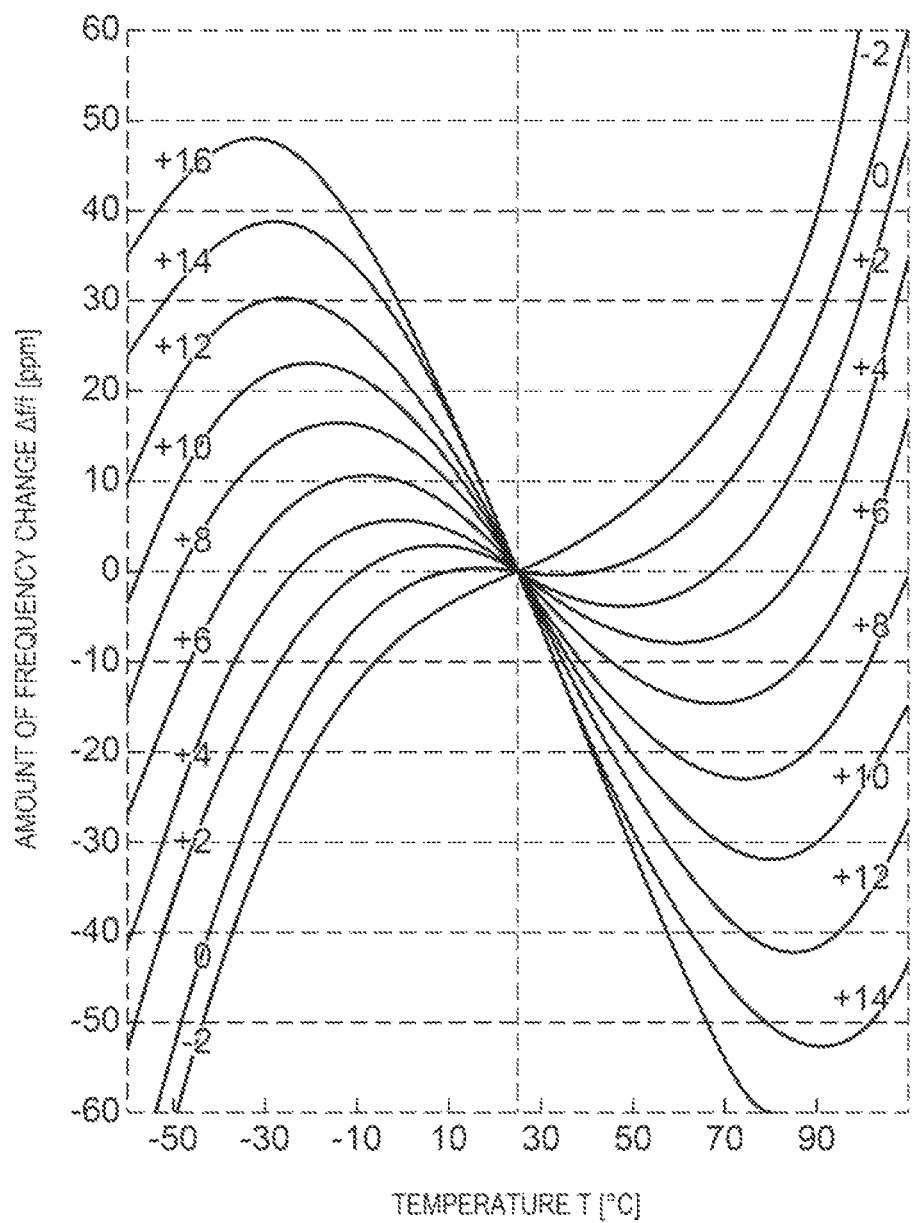
FIG. 4 shows the relationship of the cutting angle and the frequency-temperature characteristic of the quartz substrate.

The relationship between the cutting angle and the frequency-temperature characteristic of the quartz substrate 2 will next be described with reference to FIGS. 4 and 5. FIG. 4 shows the relationship of the frequency-temperature characteristic with the cutting angle of a rotated-Y-cut quartz substrate with the cutting angle changed by an increment of 2' with respect to an AT-cut quartz substrate having the cutting angle of 35° 15'. For example, in FIG. 4, the curve labeled with +10 represents the frequency-temperature characteristic of the rotated-Y-cut quartz substrate having a cutting angle of 35° 15'+10', that is, a cutting angle of 35° 25'. Changing the cutting angle as described above allows adjustment of the amount of frequency change Δf/f with respect to a temperature change.

In the present embodiment, one of the pair of second excitation electrodes 6, which excite the second vibration section 5, is provided on the first inclining surface 17, and the other second excitation electrode 6 is provided on the second principal surface 16b, so that the frequency-temperature characteristic of the second vibration device X2 in the present embodiment is somewhere between the frequency-temperature characteristic corresponding to the cutting angle θ1+θ2=35° 15'+θ2 of the first inclining surface 17 and the frequency-temperature characteristic corresponding to the cutting angle θ1=35° 15' of the second principal surface 16b. Specifically, the amount of change Δf/f in the frequency of the second vibration device X2 with respect to a change in the temperature thereof is the amount of frequency change Δf/f with respect to a temperature change when the cutting angle is ((θ1+θ2)+θ1)/2=(2θ1+θ2)/2, that is, θ1+θ2/2=35° 15'+θ2/2.

One of the pair of third excitation electrodes 8, which excite the third vibration section 7, is provided on the second inclining surface 18, and the other third excitation electrode 8 is provided on the second principal surface 16b, so that the frequency-temperature characteristic of the third vibration device X3 in the present embodiment is somewhere between the frequency-temperature characteristic corresponding to the cutting angle of 35° 15'−θ3 of the second inclining surface 18 and the frequency-temperature characteristic corresponding to the cutting angle of 35° 15' of the second principal surface 16b. Specifically, the amount of change Δf/f in the frequency of the third vibration device X3 with respect to a change in the temperature thereof is the amount of frequency change Δf/f with respect to a temperature change when the cutting angle is 35° 15'−θ3/2.

Figure 5:
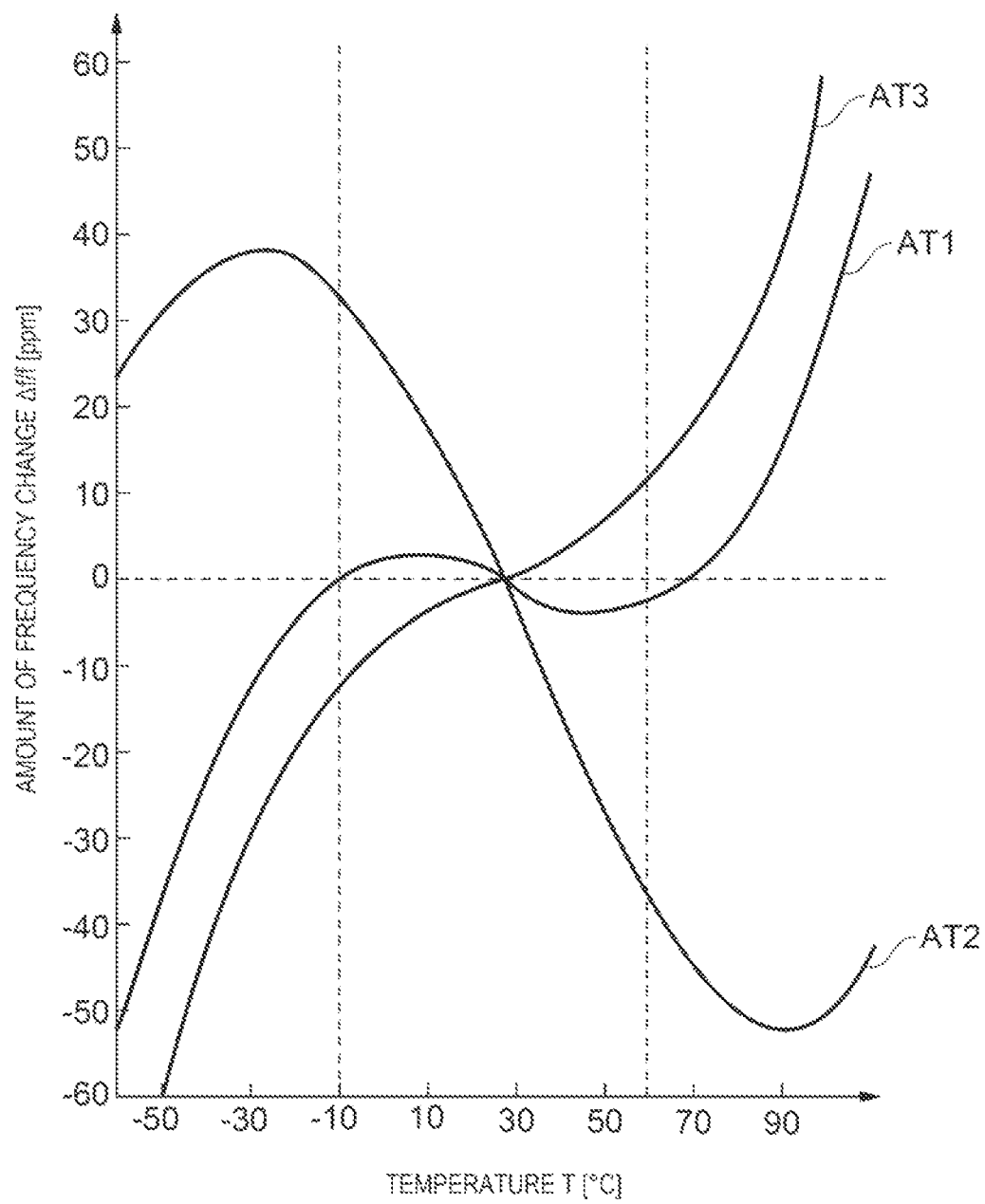
FIG. 5 shows an example of the frequency-temperature characteristic of the vibration device.

In FIG. 5 showing an example of the frequency-temperature characteristic of the vibration device 1 according to the present embodiment, AT1 represents the frequency-temperature characteristic of the first vibration device X1, AT2 represents the frequency-temperature characteristic of the second vibration device X2, and AT3 represents the frequency-temperature characteristic of the third vibration device X3.

Since the angle θ1 of the first vibration section 3 is 35° 15', and the At-cut quartz substrate is used as it is, the amount of change Δf/f in the frequency of the first vibration device X1 with respect to a change in the temperature thereof is small. Using the first vibration device X1 as a vibration device for oscillation signal output therefore allows generation of a relatively stable oscillation signal with respect to a temperature change.

The amount of change Δf/f in the frequency of the second vibration section 5 with respect to a change in the temperature thereof can be so adjusted as to increase by changing the angle θ2 of the first inclining surface 17, so can the amount of change Δf/f in the frequency the third vibration section 7 with respect to a change in the temperature thereof by changing the angle θ3 of the second inclining surface 18. A large amount of change Δf/f in the frequency of the second vibration device X2 and the third vibration device X3 with respect to a change in the temperature thereof means that the resolution of a temperature change with respect to a frequency change is high and precise temperature detection can therefore be performed. Using the second vibration device X2 and the third vibration device X3 as vibration devices for temperature detection therefore allows precise temperature detection.

In the present embodiment, the cutting angle of the first inclining surface 17 of the second vibration section 5 is θ1+θ2, that is, 35° 15'+θ2, where θ1 is the cutting angle of the two principal surfaces 16a and 16b, and the cutting angle of the first inclining surface 17 of the second vibration section 5 is greater than the cutting angle θ1 of the two principal surfaces 16a and 16b. The cutting angle of the second inclining surface 18 of the third vibration section 7 is θ1−θ3, that is, 35° 15'−θ3 and is smaller than the cutting angle θ1 of the two principal surfaces 16a and 16b. Setting the cutting angle of the first inclining surface 17 of the second vibration section 5 and the cutting angle of the second inclining surface 18 of the third vibration section 7 differ from each other allows the frequency-temperature characteristics of the second vibration device X2 and the third vibration device X3 for temperature detection to differ from each other.

The configuration in which the frequency-temperature characteristics of the second vibration device X2 and the third vibration device X3 for temperature detection differ from each other allows, for example, temperature detection based on the second vibration device X2 over a temperature range where the second vibration device X2 has higher resolution of a temperature change with respect to a frequency change than the third vibration device X3 and can therefore perform precise temperature detection and temperature detection based on the third vibration device X3 over a temperature range where the third vibration device X3 has higher resolution of a temperature change with respect to a frequency change than the second vibration device X2 and can therefore perform precise temperature detection. More precise temperature detection can thus be performed.

For example, in a temperature range where the temperature T ranges from −10 to 60° C. in FIG. 5, since the second vibration device X2 has higher resolution of a temperature change with respect to a frequency change than the third vibration device X3, the temperature detection may be performed based on the second vibration device X2. On the other hand, in a temperature range where the temperature T is lower than −10° C. or higher than 60° C., the second vibration device X2 has low resolution of a temperature change with respect to a frequency change, and further, a change in the frequency of the second vibration device X2 does not show a monotonous increase or decrease with respect to a change in the temperature of the second vibration device X2. Therefore, in the temperature range where the temperature T is lower than −10° C. or higher than 60° C., the temperature detection may be performed based on the third vibration device X3, which has higher resolution of a temperature change with respect to a frequency change than the second vibration device X2.

The temperature range over which the second vibration device X2 is used to perform the temperature detection and the temperature range over which the third vibration device X3 is used to perform the temperature detection are not limited to the temperature ranges described above and can be arbitrarily set based on the frequency-temperature characteristics of the second vibration section 5 and the third vibration section 7.

Further, since the first vibration device X1, the second vibration device X2, and the third vibration device X3 are formed on the common quartz substrate 2, heat transfer is quickly performed among the first vibration device X1, the second vibration device X2, and the third vibration device X3. The temperature of the first vibration device X1 can therefore be quickly and precisely detected by the second vibration device X2 and the third vibration device X3 for temperature detection, whereby the temperature of the first vibration device X1 can be quickly and precisely compensated.

A method for manufacturing the vibration device 1 will be described below with reference to FIGS. 6 to 11. The method for manufacturing the vibration device 1 includes a quartz substrate preparation step, a resist application step, a dry etching step, an individualization step, and an electrode formation step.

1.1 Quartz Substrate Preparation Step

Figure 6:
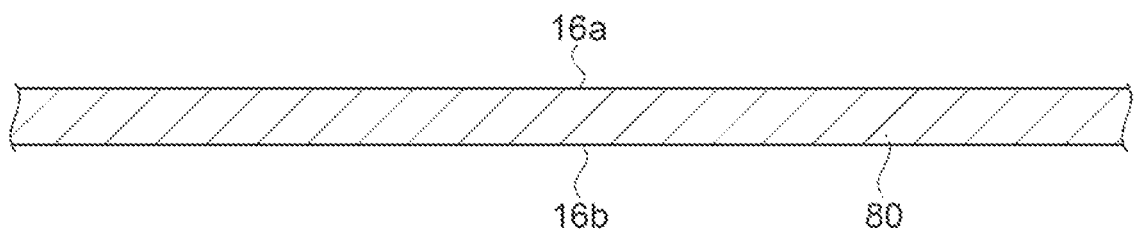
FIG. 6 is a cross-sectional diagrammatic view showing one of the steps of manufacturing the vibration device.

A large quartz substrate 80, which allows a plurality of vibration devices 1 to be manufactured in a batch process method in consideration of the mass productivity and manufacturing cost of the vibration device 1, as shown in FIG. 6. The large quartz substrate 80 is produced by cutting a quartz raw material at the predetermined cutting angle θ1 and lapping, polishing, and otherwise processing the cut quartz material into a desired thickness. In the first embodiment, the cutting angle θ1 is 35° 15'.

1.2 Resist Application Step

Figure 7:
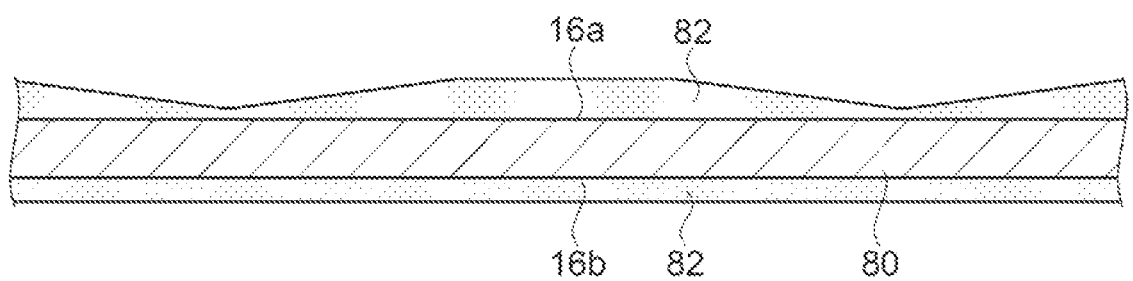
FIG. 7 is a cross-sectional diagrammatic view showing one of the steps of manufacturing the vibration device.

A resist 82 is applied onto each of the two principal surfaces 16a and 16b of the large quartz substrate 80, as shown in FIG. 7. A method for applying the resist 82 onto the first principal surface 16a includes filling a die having a recess corresponding to the shape of the first inclining surface 17, where the second excitation electrode 6 is formed, and the second inclining surface 18, where the third excitation electrode 8 is formed, with the resist 82, transferring the resist 82 with which the die has been filled onto the first principal surface 16a, and curing the resist 82.

1.3 Dry Etching Step

Figure 8:
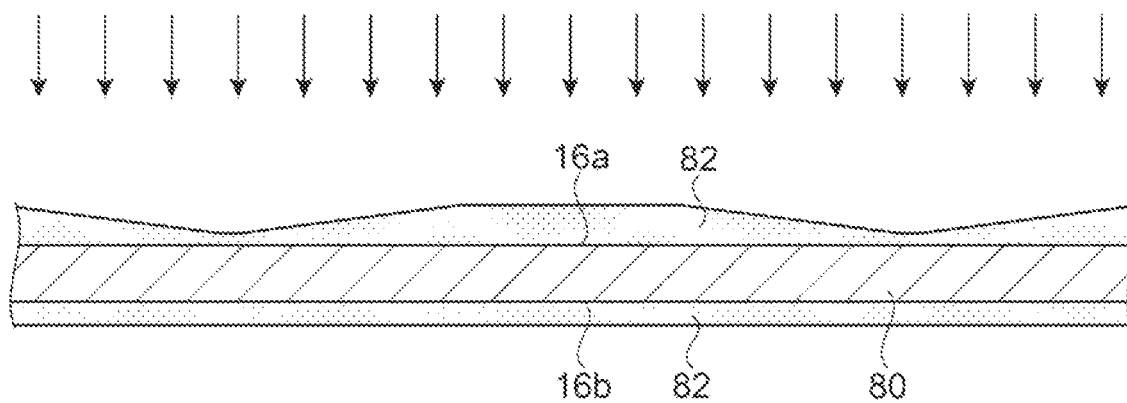
FIG. 8 is a cross-sectional diagrammatic view showing one of the steps of manufacturing the vibration device.

A dry etching method along, for example, with a plasma etcher is then used to perform dry etching on the first principal surface 16a from above, as indicated by the arrows in FIG. 8.

Figure 9:
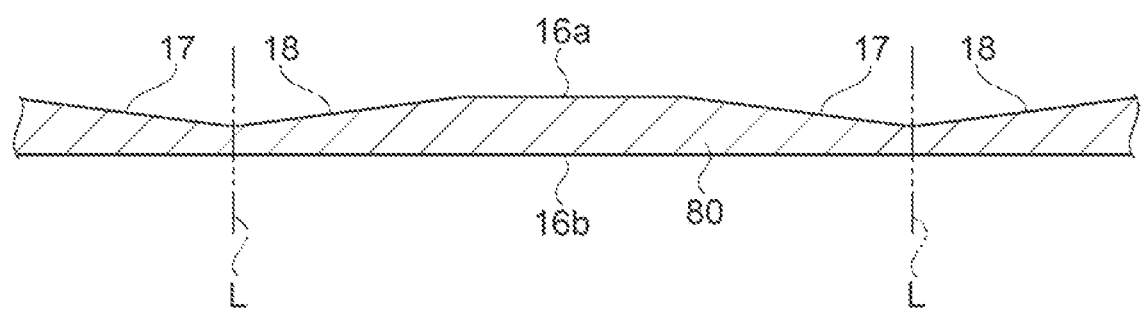
FIG. 9 is a cross-sectional diagrammatic view showing the one of the steps of manufacturing the vibration device.

FIG. 9 shows the state in which the resist 82 has been removed by the dry etching. The shape of the resist 82 that is formed in FIG. 7 and conforms to the shape of the first principal surface 16a including the inclining surfaces is exactly transferred onto the large quartz substrate 80, which is thinned accordingly. The first inclining surface 17 and the second inclining surface 18 are thus formed on the large quartz substrate 80.

1.4 Individualization Step

Figure 10:
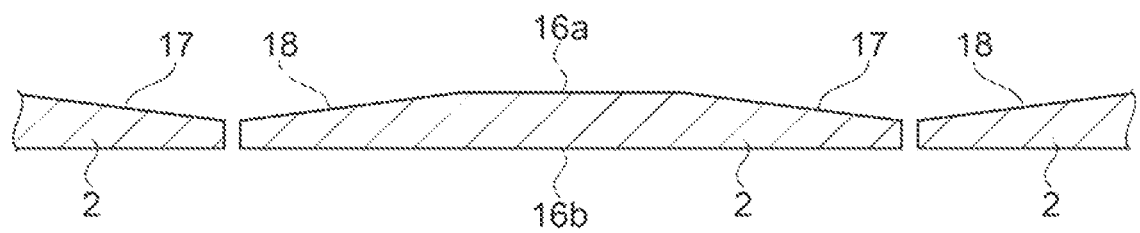
FIG. 10 is a cross-sectional diagrammatic view showing one of the steps of manufacturing the vibration device.

In FIG. 9, since a plurality of quartz pieces are linked to each other to form the large quartz substrate 80, the large quartz substrate 80 is individualized. The large quartz substrate 80 is individualized by dicing or wet etching along imaginary lines L in FIG. 9. FIG. 10 shows individualized quartz substrates 2.

1.5 Electrode Formation Step

Figure 11:
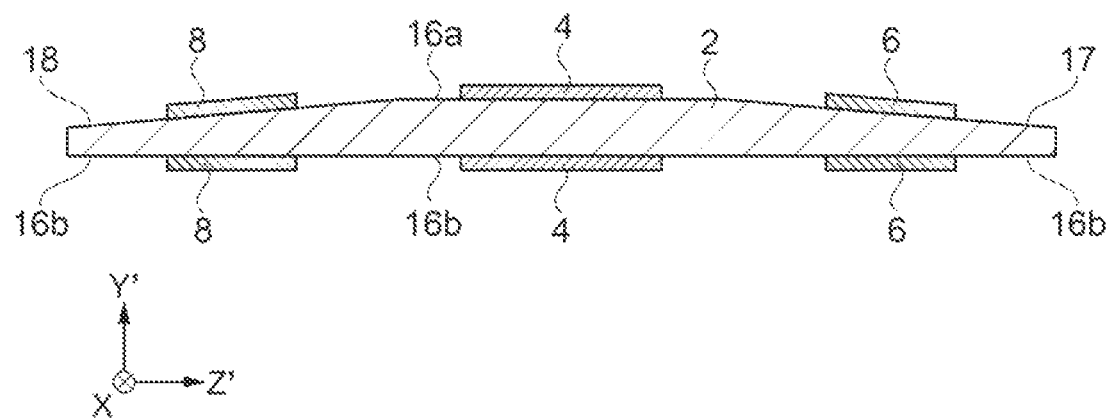
FIG. 11 is a cross-sectional diagrammatic view showing one of the steps of manufacturing the vibration device.

The first excitation electrodes 4, the second excitation electrodes 6, the third excitation electrodes 8, and other components are formed on each of the individualized quartz substrates 2 by deposition or sputtering to form the vibration device 1, as shown in FIG. 11.

The first inclining surface 17 and the second inclining surface 18 may be formed by a method other than the method described above. For example, as a method for forming the resist 82 part of which is thinned, grayscale light exposure in which the resist 82 is exposed to light under different light intensity distribution conditions may be used.

Still instead, before individualizing the large quartz substrate 80, the first excitation electrodes 4, the second excitation electrodes 6, the third excitation electrodes 8, and other components may be collectively formed on the large quartz substrate 80, and the resultant structure may then be individualized into the vibration devices 1.

The first vibration device X1, the second vibration device X2, and the third vibration device X3 are formed on the common quartz substrate 2, whereby heat transfer is quickly performed among the first vibration device X1, the second vibration device X2, and the third vibration device X3. Since the first inclining surface 17 and the second inclining surface 18 can be formed in a manufacturing method in which the burden on the quartz substrate is small, such as a dry etching method, a decrease in mechanical strength and chronological degradation of the quartz substrate 2 are unlikely to occur.

In the present embodiment, the first vibration section 3 is excited by the pair of first excitation electrodes formed on the two principal surfaces 16a and 16b of the quartz substrate 2, and the second vibration section 5 and the third vibration section 7 are so configured that one of the pair of second excitation electrodes 6 and one of the pair of third excitation electrodes 8 are formed on the first inclining surface 17 and the second inclining surface 18, which incline with respect to the two principal surfaces 16a and 16b by the angles θ2 and θ3, respectively, whereby the frequency-temperature characteristic of the first vibration device X1 including the first vibration section 3 can differ from the frequency-temperature characteristic of the second vibration device X2 including the second vibration section 5 and the frequency-temperature characteristic of the third vibration device X3 including the third vibration section 7.

The configuration in which the first vibration section 3 is produced at a cutting angle that achieves a frequency-temperature characteristic providing a small amount of frequency change and the first inclining surface 17 of the second vibration section 5 and the second inclining surface 18 of the third vibration section 7 are produced at cutting angles that achieve frequency-temperature characteristics each providing a large amount of frequency change allows the first vibration device X1 to be used for oscillation signal output and the second vibration device X2 and the third vibration device X3 to be used for temperature detection.

The second inclining surface 18 inclines with respect to the first inclining surface 17. That is, setting the cutting angle of the first inclining surface 17 and the cutting angle of the second inclining surface 18 differ from each other allows the frequency-temperature characteristic of the second vibration device X2 and the frequency-temperature characteristic of the third vibration device X3 to differ from each other.

Therefore, for example, the configuration in which the temperature detection is performed based on the second vibration device X2 over the temperature range where the second vibration device X2 has higher resolution of a temperature change with respect to a frequency change than the third vibration device X3 and can therefore perform precise temperature detection and the temperature detection is performed based on the third vibration device X3 over the temperature range where the third vibration device X3 has higher resolution of a temperature change with respect to a frequency change than the second vibration device X2 and can therefore perform precise temperature detection allows more precise temperature detection to be performed.

In the present embodiment, since the first inclining surface 17 and the second inclining surface 18 incline in such a way that the thickness of each of the second vibration section 5 and the third vibration section 7 decreases as the distance from the first vibration section 3 increases, the frequency-temperature characteristic of the first vibration section 3 can differ from the frequency-temperature characteristics of the second vibration section 5 and the third vibration section 7. Therefore, the frequency-temperature characteristic of the first vibration device X1 can be suitable for oscillation signal output, while the frequency-temperature characteristics of the second vibration detection X2 and the third vibration device X3 can be suitable for temperature detection.

Further, since the first vibration device X1, the second vibration device X2, and the third vibration device X3 are formed on the common quartz substrate 2, heat transfer is quickly performed among the first vibration device X1, the second vibration device X2, and the third vibration device X3. The temperature of the first vibration device X1 can therefore be quickly and precisely detected by the second vibration device X2 and the third vibration device X3 for temperature detection, whereby the temperature of the first vibration device X1 can be quickly and precisely compensated.

In the first embodiment, the first vibration section 3, the second vibration section 5, and the third vibration section 7 are arranged along the positive direction of the axis Z' in the order of the third vibration section 7, the first vibration section 3, and the second vibration section 5, but the first vibration section 3, the second vibration section 5, and the third vibration section 7 are not necessarily arranged as described above.

The first inclining surface 17 is formed as part of the first principal surface 16a of the quartz substrate 2 in the present embodiment and may instead be formed as part of the second principal surface 16b or may still instead be formed as part of both the principal surfaces 16a and 16b.

The second inclining surface 18 is formed as part of the first principal surface 16a of the quartz substrate 2 in the present embodiment and may instead be formed as part of the second principal surface 16b or may still instead be formed as part of both the principal surfaces 16a and 16b.

When an AT-cut quartz substrate is used as the quartz substrate 2, and one of the first inclining surface 17 and the second inclining surface 18 of the quartz substrate 2 that is the inclining surface cut at a larger cutting angle is cut at a cutting angle θa and the other inclining surface is cut at a cutting angle θb, θb is preferably greater than or equal to θa−5' but smaller than or equal to θa−20°. When the cutting angle θb is greater than or equal to θa−5', the difference between the cutting angle of the first inclining surface 17 of the quartz substrate 2 and the cutting angle of the second inclining surface 18 of the quartz substrate 2 is sufficiently large, whereby the frequency-temperature characteristics of the second vibration device X2 and the third vibration device X3 for temperature detection can sufficiently differ from each other and precise temperature detection can therefore performed. When the cutting angle θb increases, it is difficult to form the inclining surface, and cutting angle θb is therefore preferably smaller than or equal to θa−20°. In the present embodiment, the cutting angle θ1+θ2 of the first inclining surface 17 corresponds to θa, and the cutting angle θ1−θ3 of the second inclining surface 18 corresponds to θb.

2. Second Embodiment

A schematic configuration of a vibration device 1a according to a second embodiment will be described with reference to FIGS. 12 and 13. The same configurations as those in the first embodiment have the same reference characters, and no redundant description of the same configurations will be made.

Figure 12:
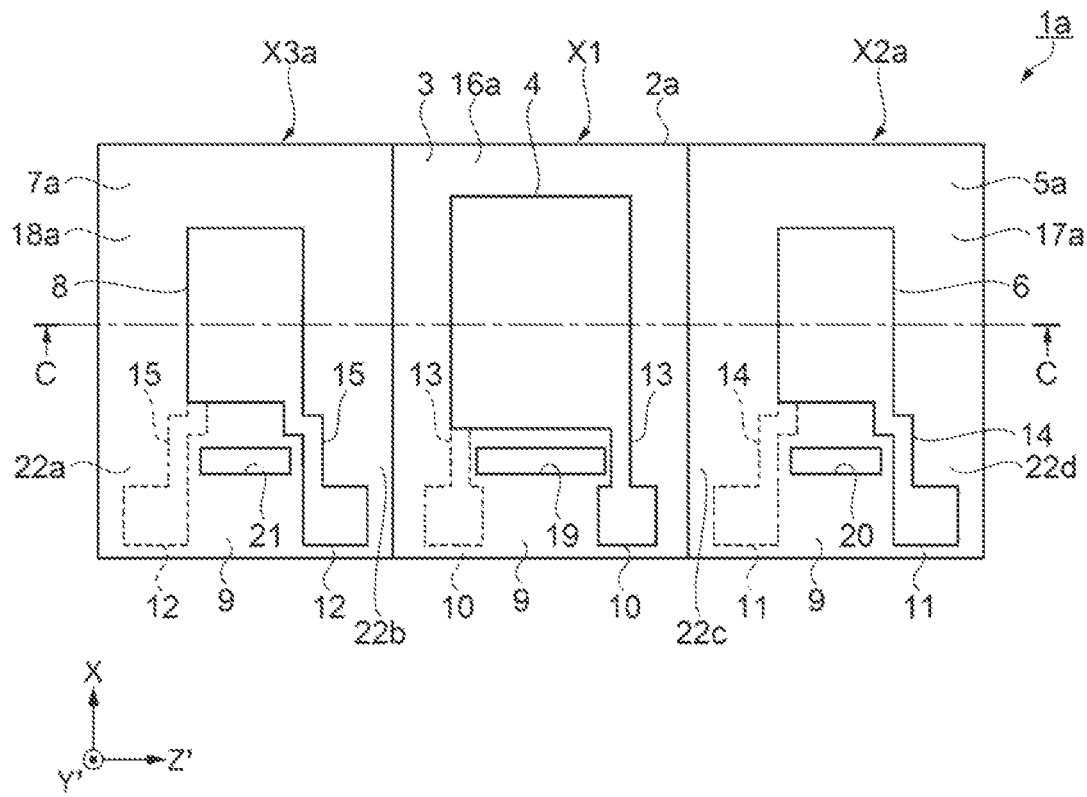
FIG. 12 is a plan view showing the vibration device according to a second embodiment.
Figure 13:
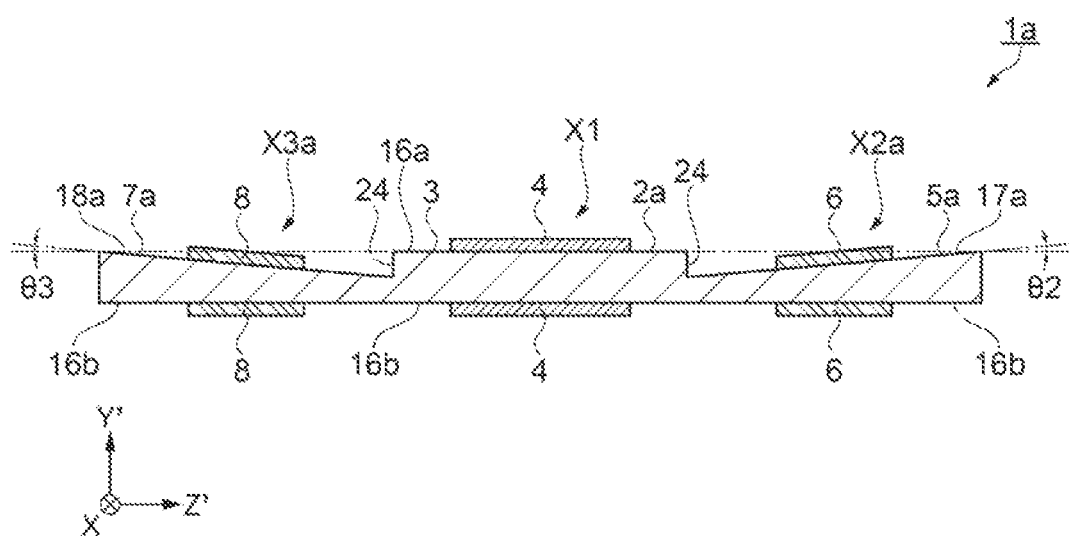
FIG. 13 is a cross-sectional view taken along the line C-C in FIG. 12.

In the second embodiment, the first vibration section 3, a second vibration section 5a, and a third vibration section 7a are arranged along the positive direction of the axis Z' in the order of the third vibration section 7a, the first vibration section 3, and the second vibration section 5a, as shown in FIGS. 12 and 13.

In the second embodiment, a quartz substrate 2a is so configured that a first inclining surface 17a provided at the second vibration section 5a and a second inclining surface 18a provided at the third vibration section 7a incline in such a way that the thickness of each of the second vibration section 5a and the third vibration section 7a decreases as the distance to the first vibration section 3 decreases.

The first inclining surface 17a of the quartz substrate 2a is rotated from the axis Z' by the angle θ2 in the negative direction around the axis X. That is, the cutting angle of the first inclining surface 17a is θ1−θ2, that is, 35° 15'−θ2, where the cutting angle of the two principal surfaces 16a and 16b is θ1, and is therefore smaller than the cutting angle θ1 of the two principal surfaces 16a and 16b. The second inclining surface 18a of the quartz substrate 2a is rotated from the axis Z' by the angle θ3 in the positive direction around the axis X. That is, the cutting angle of the second inclining surface 18a is θ1+θ3, that is, 35° 15'+θ3 and is therefore greater than the cutting angle θ1 of the two principal surfaces 16a and 16b. As described above, the cutting angle of the first inclining surface 17a is θ1−θ2, and the cutting angle of the second inclining surface 18a is θ1+θ3, so that the cutting angle of the first inclining surface 17a differs from the cutting angle of the second inclining surface 18a.

Further, the first vibration section 3 has steps 24 at the end surfaces of the first vibration section 3, and the first vibration section 3 is so shaped as to protrude in the positive direction of the axis Y' with respect to the first inclining surface 17a of the second vibration section 5a and the second inclining surface 18a of the third vibration section 7a.

According to the present embodiment, the frequency-temperature characteristics of a second vibration device X2a including the second vibration section 5a and a third vibration device X3a including the third vibration section 7a allow an increase in the amount of frequency change as compared with the frequency-temperature characteristic of the first vibration device X1 including the first vibration section 3, whereby when the second vibration device X2a and the third vibration device X3a are used to perform the temperature detection the second vibration device X2a and the third vibration device X3a have a high resolution of temperature change with respect to a frequency change and can therefore perform, which is one of the same effects provided by the first embodiment.

Further, the present embodiment can provide the following effects in addition to the effects provided by the first embodiment.

The first inclining surface 17a inclines in such a way that the thickness of the second vibration section 5a increases as the distance from the first vibration section 3 increases. Therefore, since the vibration of the second vibration section 5a shifts toward a thicker portion of the quartz substrate 2a, the vibration area of the second vibration section 5a is away from the first vibration section 3. The effect of the vibration of the second vibration section 5a on the first vibration section 3 can therefore be reduced.

Since the second inclining surface 18a also inclines in such a way that the thickness of the third vibration section 7a increases as the distance from the first vibration section 3 increases, the effect of the vibration of the third vibration section 7a on the first vibration section 3 can be reduced.

The end surfaces of the first vibration section 3 are provided with the steps 24. The step 24 can confine the energy of the vibration of the first vibration section 3 in the first vibration section 3 to reduce vibration leakage, whereby the vibration of the first vibration section 3 can be stabilized.

3. Third Embodiment

A schematic configuration of a vibration device 1b according to a third embodiment will be described with reference to FIGS. 14 and 15. The same configurations as those in the first embodiment have the same reference characters, and no redundant description of the same configurations will be made.

Figure 14:
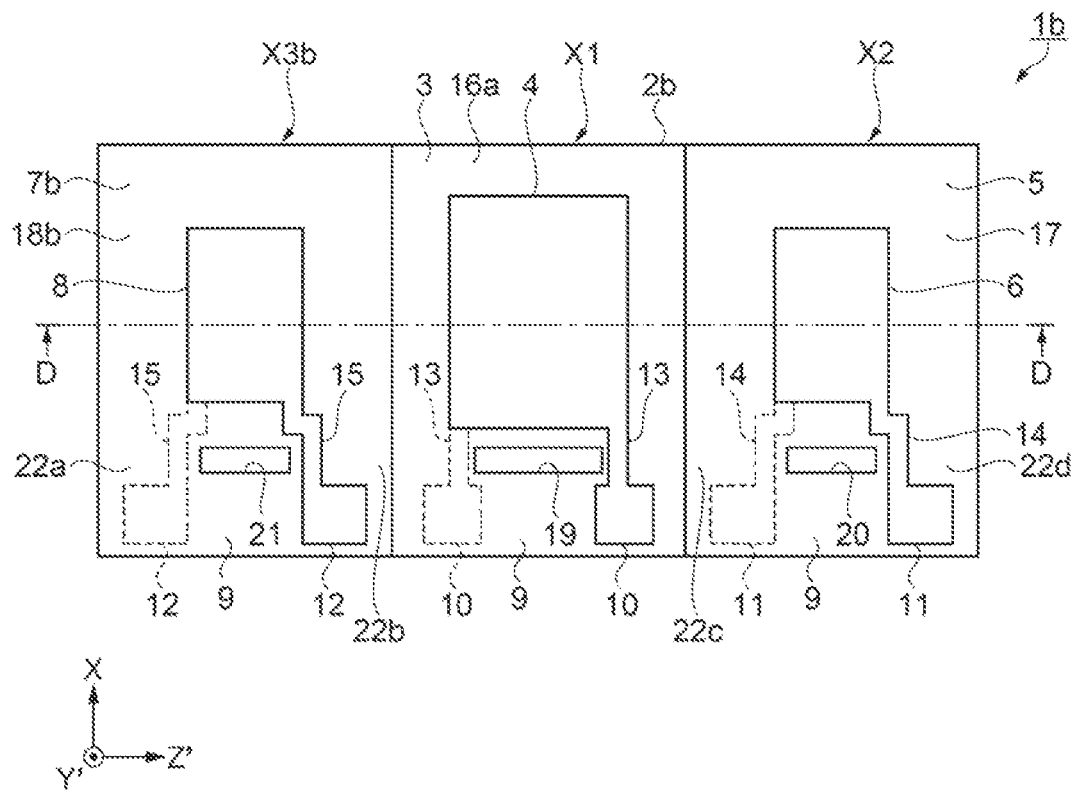
FIG. 14 is a plan view showing the vibration device according to a third embodiment.
Figure 15:
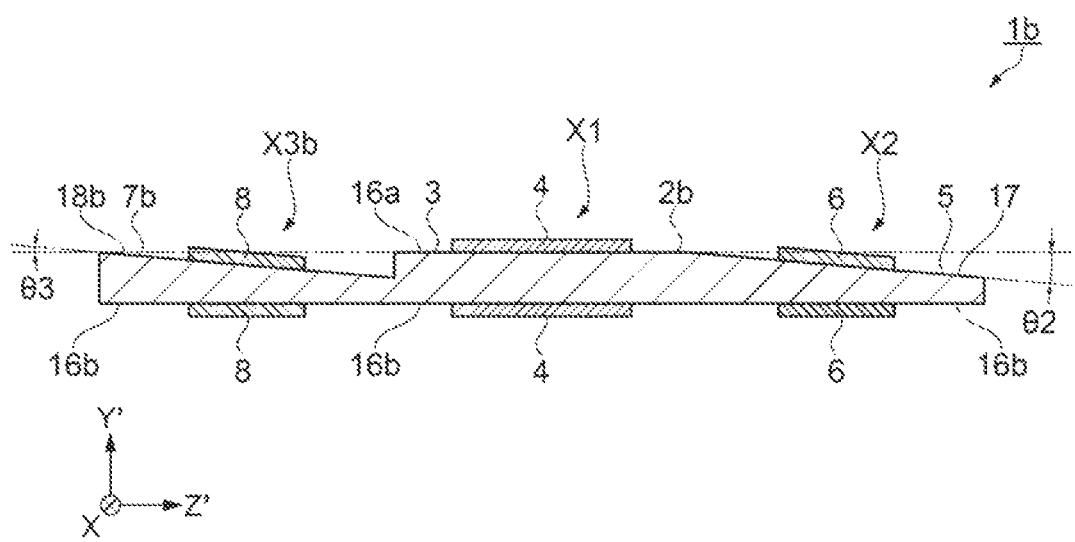
FIG. 15 is a cross-sectional view taken along the line D-D in FIG. 14.

In the third embodiment, the first vibration section 3, the second vibration section 5, and a third vibration section 7b are arranged along the positive direction of the axis Z' in the order of the third vibration section 7b, the first vibration section 3, and the second vibration section 5, as shown in FIGS. 14 and 15.

In the third embodiment, a quartz substrate 2b is so configured that the first inclining surface 17 provided at the second vibration section 5 inclines in such a way that the thickness of the second vibration section 5 decreases as the distance from the first vibration section 3 increases, and that a second inclining surface 18b provided at the third vibration section 7b inclines in such a way that the thickness of the third vibration section 7b decreases as the distance to the first vibration section 3 decreases.

The second inclining surface 18b of the quartz substrate 2b is rotated from the axis Z' by the angle θ3 in the positive direction around the axis X. That is, the cutting angle of the second inclining surface 18b is θ1+θ3, that is, 35° 15'+θ3.

In the third embodiment, the first inclining surface 17 of the quartz substrate 2b and the second inclining surface 18b of the quartz substrate 2b are each an inclining surface rotated from the axis Z' in the positive direction around the axis X, with the cutting angle of the first inclining surface 17 being θ1+θ2, and the cutting angle of the second inclining surface 18b being θ1+θ3. However, since the angle θ2 of the first inclining surface 17 differs from the angle θ3 of the second inclining surface 18b, the cutting angle of the first inclining surface 17 differs from the cutting angle of the second inclining surface 18b.

In the present embodiment, the third vibration section 7b is so configured that one of the pair of third excitation electrodes 8 is formed on the second inclining surface 18b, which inclines with respect to the two principal surfaces 16a and 16b, whereby the frequency-temperature characteristic of the first vibration section 3 can differ from the frequency-temperature characteristic of the third vibration section 7b, as in the first embodiment.

Further, in the present embodiment, the cutting angle of the first inclining surface 17 differs from the cutting angle of the second inclining surface 18b. That is, since the second inclining surface 18b incline with respect to the first inclining surface 17, the frequency-temperature characteristic of the second vibration device X2 including the second vibration section 5 can differ from the frequency-temperature characteristic of a third vibration device X3b inclining the third vibration section 7b.

Since the first inclining surface 17 of the quartz substrate 2b and the second inclining surface 18b of the quartz substrate 2b are each rotated by angles θ2 and θ3, respectively, from the axis Z' in the positive direction around the axis X that is, in the same direction, the frequency-temperature characteristic of the second vibration device X2 and the frequency-temperature characteristic of the third vibration device X3 are expressed by the same cubic curve. The between the second vibration device X2 and the third vibration device X3b allows high resolution of a temperature change with respect to a frequency change, whereby the temperature of the first vibration device X1 can be quickly and precisely detected.

4. Fourth Embodiment

A schematic configuration of a vibration device 1c according to a fourth embodiment will be described with reference to FIGS. 16 and 17. The same configurations as those in the first embodiment have the same reference characters, and no redundant description of the same configurations will be made.

Figure 16:
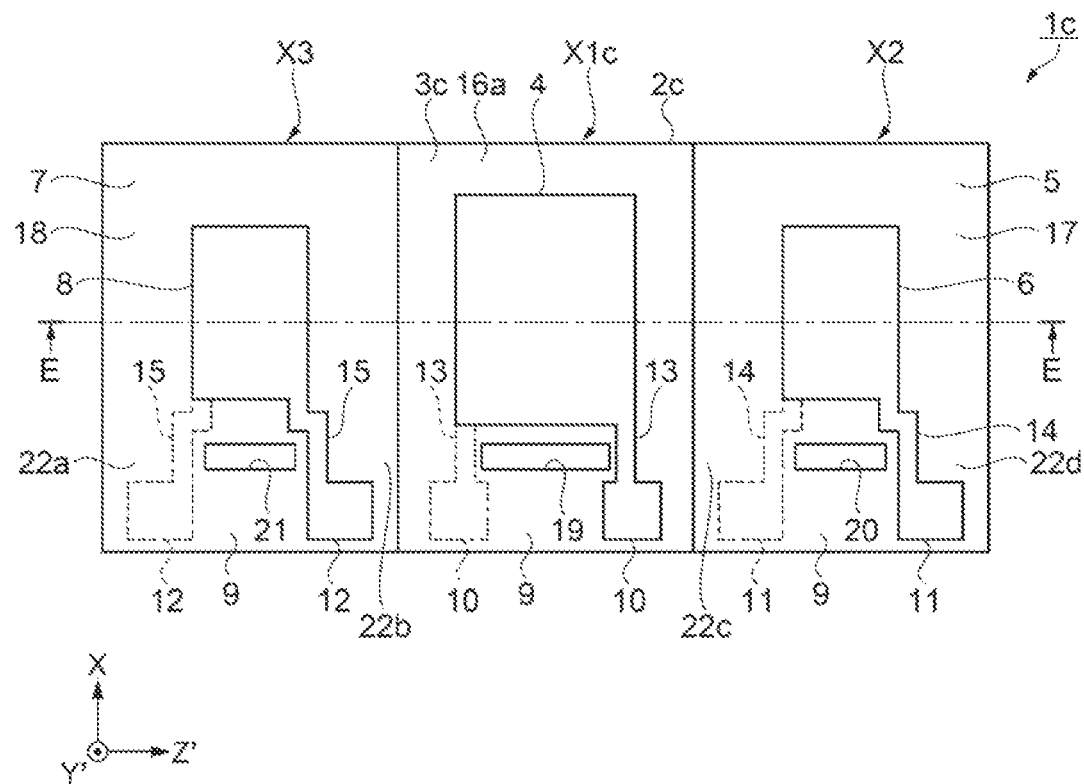
FIG. 16 is a plan view showing the vibration device according to a fourth embodiment.
Figure 17:
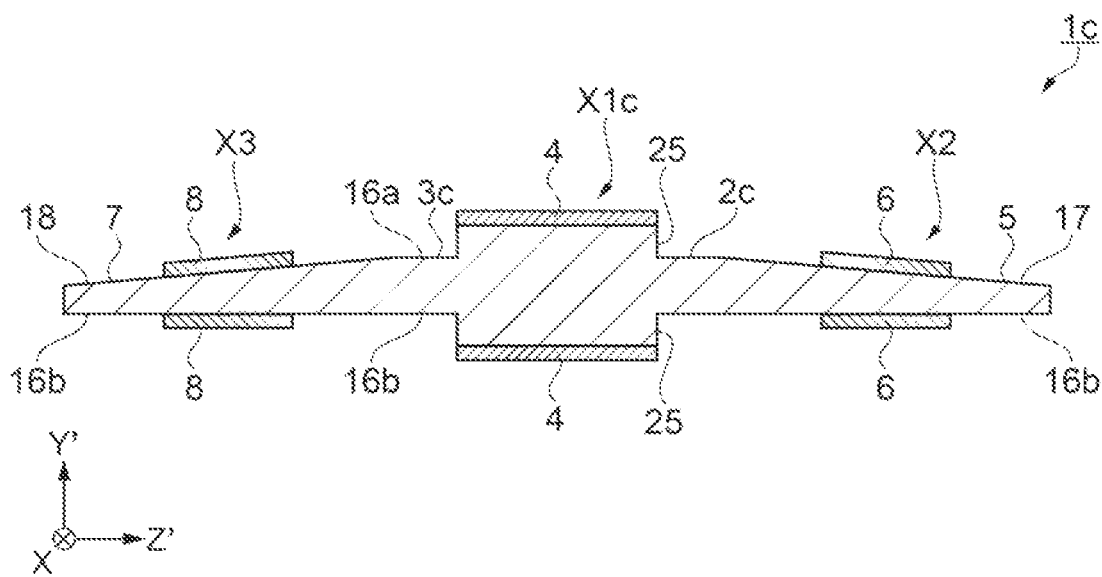
FIG. 17 is a cross-sectional view taken along the line E-E in FIG. 16.

In the fourth embodiment, a protrusion 25 is formed at each of the two principal surfaces 16a and 16b in a first vibration section 3c, as shown in FIGS. 16 and 17. The first vibration section 3c including the protrusion 25 has the pair of first excitation electrodes 4, which sandwich the first vibration section 3c in the thickness direction of a quartz substrate 2c.

The present embodiment can provide the following effects in addition to the effects provided by the first embodiment. Since an area of the first vibration section 3c that is the area including the protrusions 25 is excited by the first excitation electrodes 4 in a first vibration device X1c, the energy of the vibration of the first vibration section 3c is confined in the area including the protrusions 25, so that leakage of the vibration to areas other than the area including the protrusions 25 can be reduced, whereby the vibration of the first vibration device X1c is stabilized. Further, the impedance of the first vibration device X1c can be lowered, so that the Q value thereof increases, whereby the thus configured first vibration device X1c as an oscillator can be used to achieve a precise oscillator having an excellent carrier wave to noise ratio.

The protrusions 25 are formed at the two principal surfaces 16a and 16b of the first vibration section 3c in the present embodiment, and a protrusion may instead be formed at one of the two principal surfaces 16a and 16b of the first vibration section 3c.

The protrusions 25 have a mesa shape protruding from the two principal surfaces 16a and 16b of the first vibration section 3c in the direction along the axis Y' in the present embodiment, and the protrusions 25 may instead each have a spherical shape.

5. Fifth Embodiment

A schematic configuration of a vibration device 1d according to a fifth embodiment will be described with reference to FIGS. 18 and 19. The same configurations as those in the first embodiment have the same reference characters, and no redundant description of the same configurations will be made.

Figure 18:
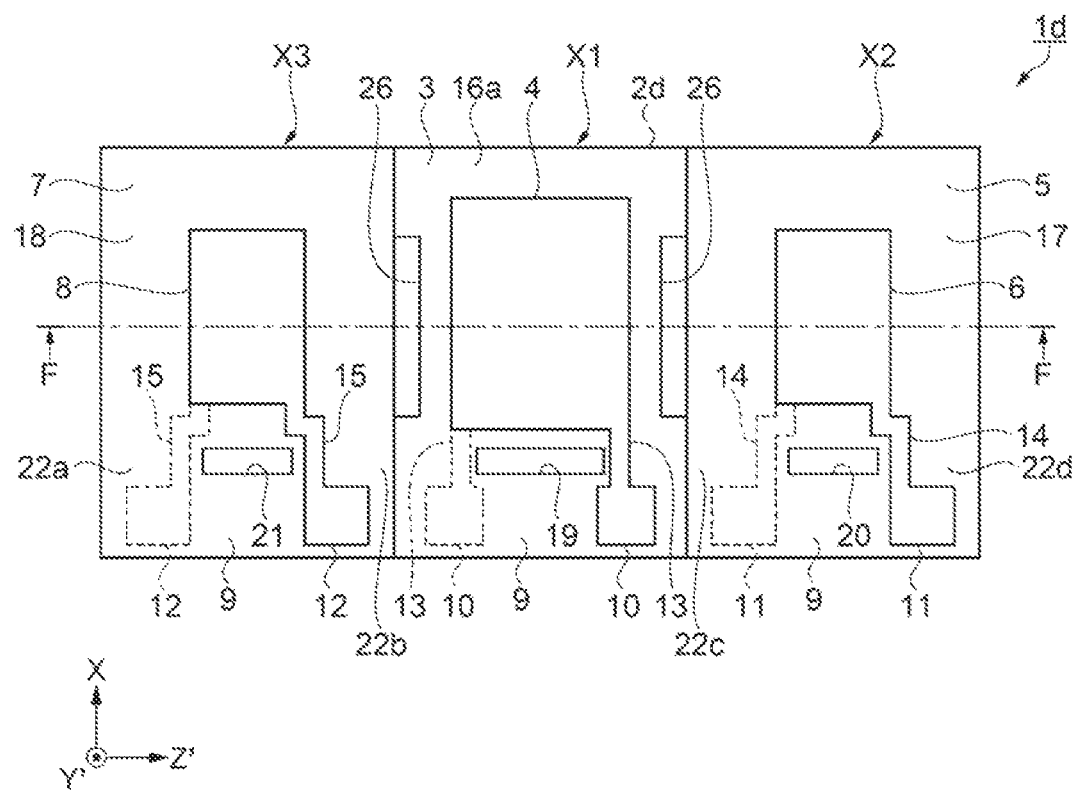
FIG. 18 is a plan view showing the vibration device according to a fifth embodiment.
Figure 19:
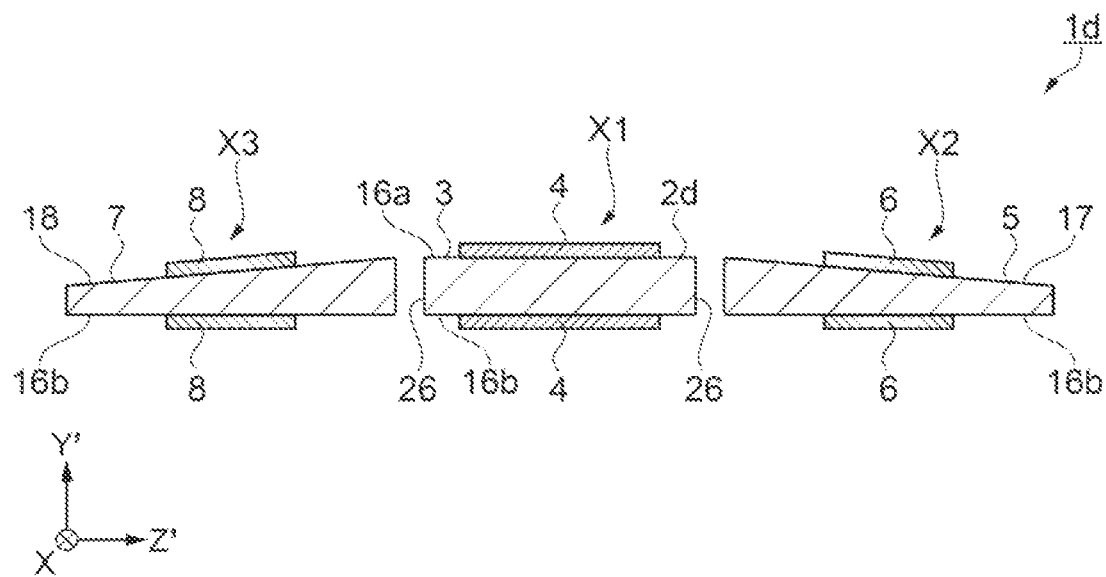
FIG. 19 is a cross-sectional view taken along the line F-F in FIG. 18.

In the fifth embodiment, a quartz substrate 2d has through holes 26 between the first vibration section 3 and the second vibration section 5 and between the first vibration section 3 and the third vibration section 7, as shown in FIGS. 18 and 19.

The present embodiment can provide the following effect in addition to the effects provided by the first embodiment. Providing the through holes 26 between the first vibration section 3 and the second vibration section 5 and between the first vibration section 3 and the third vibration section 7 can suppress the effect of the vibration of the first vibration section 3 and the vibration of the second vibration section 5 and the third vibration section 7 on each other.

6. Sixth Embodiment

A schematic configuration of a vibration device 1e according to a sixth embodiment will be described with reference to FIGS. 20 and 21. The same configurations as those in the first embodiment have the same reference characters, and no redundant description of the same configurations will be made.

Figure 20:
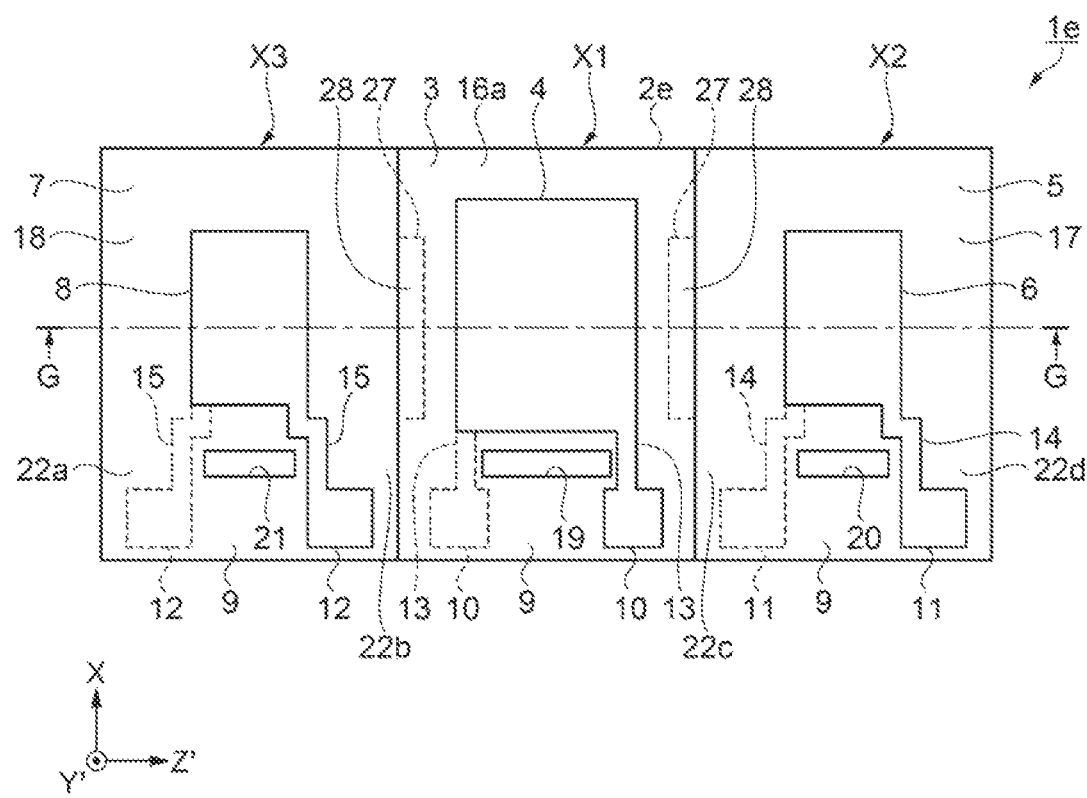
FIG. 20 is a plan view showing the vibration device according to a sixth embodiment.
Figure 21:
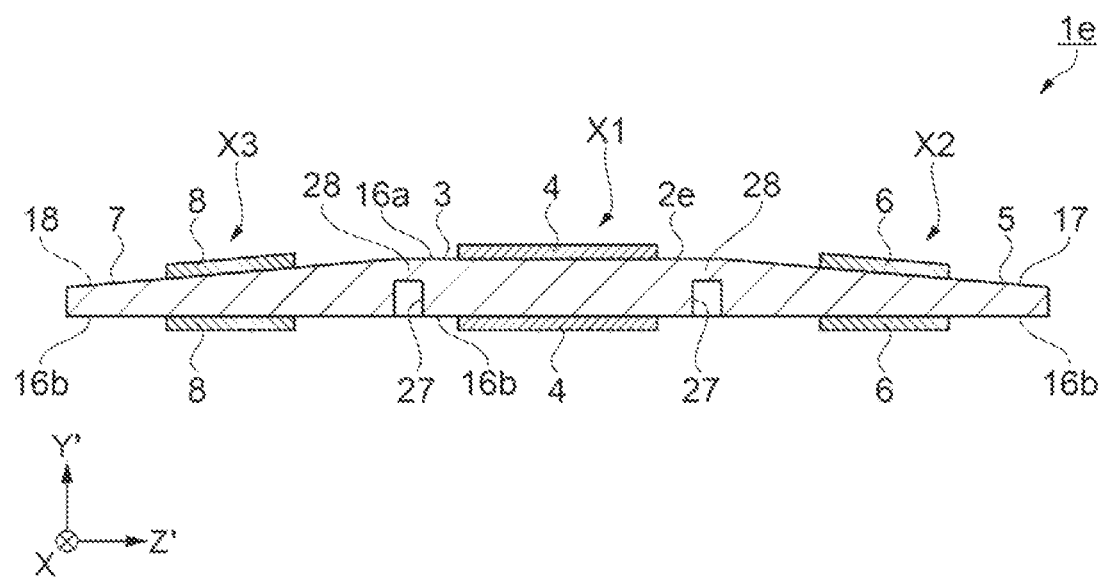
FIG. 21 is a cross-sectional view taken along the line G-G in FIG. 20.

In the sixth embodiment, a quartz substrate 2e has recesses 27, which open toward the second principal surface 16b, between the first vibration section 3 and the second vibration section 5 and between the first vibration section 3 and the third vibration section 7, as shown in FIGS. 20 and 21. That is, thin sections 28 are formed between the first vibration section 3 and the second vibration section 5 and between the first vibration section 3 and the third vibration section 7, as shown in FIG. 21.

The present embodiment can provide the following effect in addition to the effects provided by the first embodiment. Providing the thin sections 28 between the first vibration section 3 and the second vibration section 5 and between the first vibration section 3 and the third vibration section 7 can suppress the effect of the vibration of the first vibration section 3 and the vibration of the second vibration section 5 and the third vibration section 7 on each other.

The recesses 27 may be formed at the first inclining surface 17, the second inclining surface 18, and the first principal surface 16a.

7. Seventh Embodiment

A schematic configuration of an oscillator 100 according to a seventh embodiment will be described with reference to FIGS. 22 to 24. In the oscillator 100 according to the seventh embodiment, any of the vibration devices 1, 1a, 1b, 1c, 1d, and 1e described above can be used, and the following description will be made of a case where the vibration device 1 described in the first embodiment is used.

Figure 22:
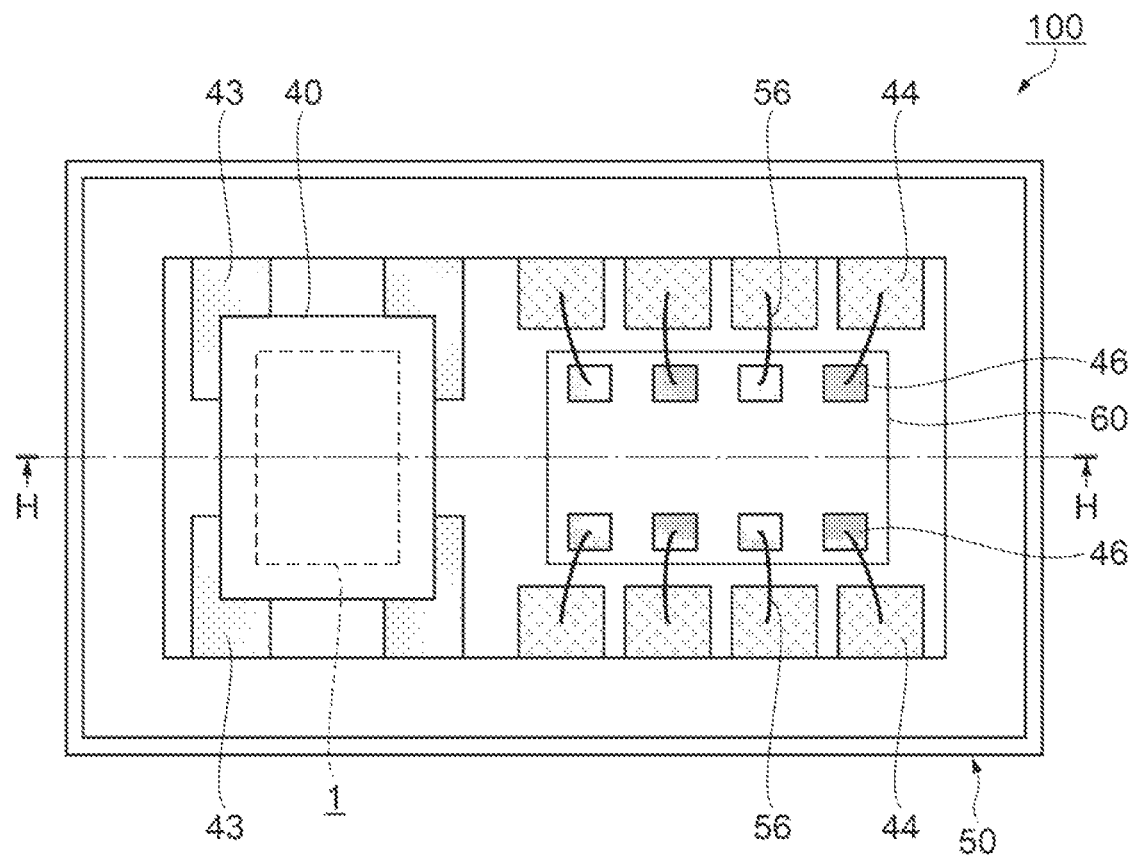
FIG. 22 is a plan view showing an oscillator according to a seventh embodiment.

The oscillator 100 includes a vibrator 40, which accommodates the vibration device 1, an IC chip 60, which includes oscillation circuits 61a, 61b, and 61c, which drive the vibration device 1, and a control signal output circuit 63, a package main body 50, which accommodates the vibrator 40 and the IC chip 60, and a lid member 57, which is made, for example, of glass, ceramic, or metal, as shown in FIG. 22.

Figure 23:
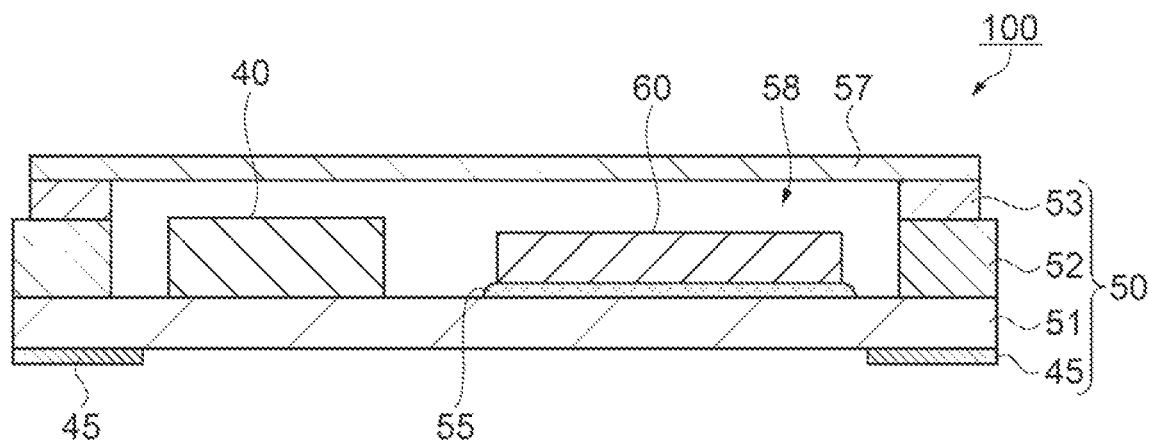
FIG. 23 is a cross-sectional view taken along the line H-H in FIG. 22.
Figure 24:
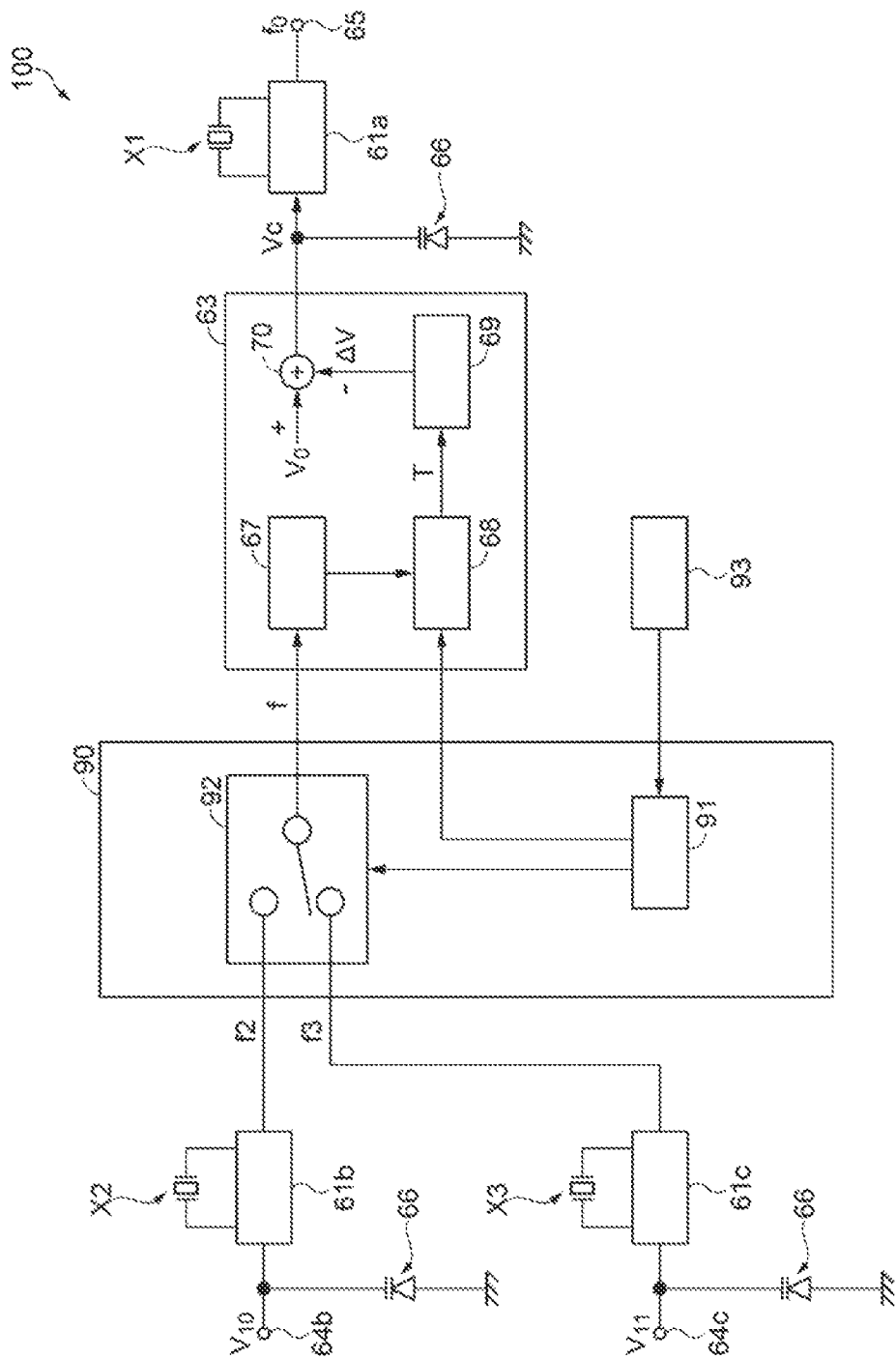
FIG. 24 is a block diagram showing the circuit configuration of the oscillator according to the seventh embodiment.

The package main body 50 is formed by layering an implementation terminal 45, a first substrate 51, a second substrate 52, and a seal ring 53 on each other, as shown in FIGS. 22 and 23. The package main body 50 has a cavity 58, which opens upward. The interior of the cavity 58, which accommodates the vibrator 40 and the IC chip 60, is hermetically sealed with a reduced pressured atmosphere or an inert gas atmosphere, such as nitrogen, by bonding the lid member 57 to the package main body 50 via the seal ring 53.

The implementation terminal 45 are actually formed of a plurality of implementation terminals 45 at the outer bottom surface of the first substrate 51. The implementation terminals 45 are electrically coupled to connection electrodes and connection terminals 44, which are provided on the upper side of the first substrate 51, via through electrodes and interlayer wiring that are not shown.

The cavity 58 in the package main body 50 accommodates the vibrator 40 and the IC chip 60. The vibrator 40 is fixed to the connection electrodes 43 provided on the first substrate 51 via solder or an electrically conductive adhesive. The IC chip 60 is fixed to the upper side of the first substrate 51 via a bonding member 55, such as an adhesive. The plurality of connection terminals 44 is provided in the cavity 58. The connection terminals 44 are electrically coupled to connection terminals 46 provided on the upper side of the IC chip 60 via bonding wires 56.

The IC chip 60 includes the first oscillation circuit 61a, which causes the first vibration device X1 to oscillate and output a first oscillation signal, the second oscillation circuit 61b, which causes the second vibration device X2 to oscillate and output a second oscillation signal, the third oscillation circuit 61c, which causes the third vibration device X3 to oscillate and output a third oscillation signal, and the control signal output circuit 63, which outputs a control signal that controls the oscillation frequency of the first oscillation signal based on the second and third oscillation signals.

The circuit configuration of the oscillator 100 will next be described. The following description will be made with reference to a TCXO as an example of the oscillator 100.

The control signal output circuit 63 is a circuit that outputs a set frequency $f_0$ via an output end 65 irrespective of a change in the temperature outside the oscillator 100 or with the effect of a change in the outside temperature suppressed. The set frequency $f_0$ is an output frequency produced when reference voltage $V_0$ is applied to the first oscillation circuit 61a at a reference temperature $T_0$.

The first oscillation circuit 61a is electrically coupled to the pair of first excitation electrodes 4 of the first vibration device X1 via the terminal 10. Similarly, the second oscillation circuit 61b intended for temperature detection is electrically coupled to the pair of second excitation electrodes 6 of the second vibration device X2 via the terminal 11. The third oscillation circuit 61c intended for temperature detection is electrically coupled to the pair of third excitation electrodes 8 of the third vibration device X3 via the terminal 12.

An output selection circuit 90, which selects a frequency f to be outputted to the control signal output circuit 63, and the control signal output circuit 63, which estimates the temperature of the first vibration device X1 based on the frequency f, which is an output signal outputted from the output selection circuit 90, and computes control voltage $V_C$ ($V_C=V_0-\Delta V$), which causes the first oscillation circuit 61a to produce the set frequency $f_0$ as the first oscillation signal at the estimated temperature, are provided between the first oscillation circuit 61a and the combination of the second oscillation circuit 61b and the third oscillation circuit 61c.

The output selection circuit 90 includes a selection controller 91 and an output selector 92. The selection controller 91 is electrically coupled to the output selector 92, a temperature sensor 93, and a temperature estimator 68. The temperature sensor 93 detects the temperature outside the vibration device 1. The selection controller 91 selects, based on the temperature detected with the temperature sensor 93, the frequency f to be outputted to the control signal output circuit 63 from an oscillation frequency f2 as the second oscillation signal outputted from the second oscillation circuit 61b and an oscillation frequency f3 as the third oscillation signal outputted from the third oscillation circuit 61c. Further, the selection control 91 controls the output selector 92 in such a way that the frequency f, which is the output signal outputted from the output selection circuit 90, is switched. The output selector 92 outputs one of the oscillation frequency f2 outputted from the second oscillation circuit 61b and the oscillation frequency f3 outputted from the third oscillation circuit 61c as the frequency f, which is an output signal outputted from the output selection circuit 90, based on the selection made by the selection control 91 to the control signal output circuit 63.

Reference voltage $V_{10}$ is inputted to the second oscillation circuit 61b via an input end 64b of the second oscillation circuit 61b, reference voltage $V_{11}$ is inputted to the third oscillation circuit 61c via an input end 64c of the third oscillation circuit 61c, and the set frequency $f_0$ is outputted via the output end 65. The reference voltage $V_{10}$ and $V_{11}$ and control voltage $V_C$ inputted to the first oscillation circuit 61a, the second oscillation circuit 61b, and the third oscillation circuit 61c are stabilized by varicap diodes 66 in advance.

The second vibration device X2 and the third vibration device X3 are each used as a temperature detector. The oscillation frequency f2 as the second oscillation signal outputted from the second oscillation circuit 61b, which drives the second vibration device X2, is an output according to the temperature T of the second vibration device X2 based on the frequency-temperature characteristic of the second vibration device X2. The oscillation frequency f3 as the third oscillation signal outputted from the third oscillation circuit 61c, which drives the third vibration device X3, is an output according to the temperature T of the third vibration device X3 based on the frequency-temperature characteristic of the third vibration device X3. The temperature T of the second vibration device X2 and the temperature T of the third vibration device X3 can thus be determined.

The first vibration device X1 is provided on the quartz substrate 2 shared by the second vibration device X2 and the third vibration device X3 as well as the first vibration device X1, and the first vibration device X1 is coupled to the second vibration device X2 and the third vibration device X3, so that no heat transfer period difference occurs, whereby the temperature T of the first vibration device X1 can be accurately estimated from the temperature T of the second vibration device X2 and the temperature T of the third vibration device X3.

Since the cutting angle of the second vibration section 5 differs from the cutting angle of the third vibration section 7, the frequency-temperature characteristic of the second vibration device X2 differs from the frequency-temperature characteristic of the third vibration device X3. In view of the fact described above, for example, the temperature T of the first vibration device X1 is estimated based on the temperature T of the second vibration device X2 over the temperature range where the second vibration device X2 has higher resolution of a temperature change with respect to a frequency change than the third vibration device X3 and can therefore perform precise temperature detection, and the temperature T of the first vibration device X1 is estimated based on the temperature T of the third vibration device X3 over the temperature range where the third vibration device X3 has higher resolution of a temperature change with respect to a frequency change than the second vibration device X2 and can therefore perform precise temperature detection. The temperature T of the first vibration device X1 can thus be more precisely estimated.

The control signal output circuit 63 computes the control voltage $V_C$ ($V_C=V_0-\Delta V$), which causes the first oscillation circuit 61a to output the set frequency $f_0$ as the first oscillation signal, based on the temperature T of the vibration device having a frequency-temperature characteristic that provides a larger amount of frequency change out of the frequency-temperature characteristic of the second vibration device X2 and the frequency-temperature characteristic of the third vibration device X3.

Specifically, the control signal output circuit 63 includes a frequency detector 67, which is formed, for example, of a frequency counter that measures the frequency f outputted from the output selection circuit 90, the temperature estimator 68, which estimates the temperature T based on the frequency f measured by the frequency detector 67, a compensation voltage computation section 69, which computes compensation voltage $\Delta V$ based on the temperature T estimated by the temperature estimator 68, and an adder 70, which outputs the control voltage $V_C$, which is the result of subtraction of the compensation voltage $\Delta V$ computed by the compensation voltage computation section 69 from the reference voltage $V_0$, to the first oscillation circuit 61a.

The temperature estimator 68 stores the frequency-temperature characteristic of the second oscillation circuit 61b shown by Expression (1) below and the frequency-temperature characteristic of the third oscillation circuit 61c shown by Expression (2) below.

When the output selector 92 selects the oscillation frequency f2 outputted from the second oscillation circuit 61b as the frequency f to be outputted to the control signal output circuit 63, the temperature estimator 68 can determine the temperature T of the second vibration device X2 based on the frequency-temperature characteristic shown by Expression (1) and the oscillation frequency f2 outputted from the second oscillation circuit 61b and estimate the temperature T of the first vibration device X1 from the temperature T of the second vibration device X2.

When the output selector 92 selects the oscillation frequency f3 outputted from the third oscillation circuit 61c as the frequency f to be outputted to the control signal output circuit 63, the temperature estimator 68 can determine the temperature T of the third vibration device X3 based on the frequency-temperature characteristic shown by Expression (2) and the oscillation frequency f3 outputted from the third oscillation circuit 61c and estimate the temperature T of the first vibration device X1 from the temperature T of the third vibration device X3.

$$f1 = f_{10}\{1 + \alpha_2(T-T_{10})^3 + \beta_2(T-T_{10}) + \gamma_2\} \quad (1)$$

$$f2 = f_{11}\{1 + \alpha_3(T-T_{11})^3 + \beta_3(T-T_{11}) + \gamma_2\} \quad (2)$$

The compensation voltage computation section 69 includes, for example, a generator that generates a cubic function that is the temperature characteristic of the first oscillation circuit 61a and is configured to determine the compensation voltage ΔV based on Expressions (3) to (5) below and the temperature T.

$$\Delta V = V_0(\Delta f/f_0) \quad (3)$$

$$\Delta f/f_0 = \alpha_1(T-T_0)^3 + \beta_1(T-T_0) + \gamma_1 \quad (4)$$

$$\Delta V = V_0\{\alpha_1(T-T_0)^3 + \beta_1(T-T_0) + \gamma_1\} \quad (5)$$

The symbols α1, β1, and γ1, α2, β2, and γ2, and α3, β3, and γ3 are constants specific to the first oscillation circuit 61a, the second oscillation circuit 61b, and the third oscillation circuit 61c, respectively, and are determined by measuring the output frequency with the temperature and the reference voltage variously changed. It is also noted that $\Delta f = f - f_0$, that $f_{10}$ is the output frequency produced when the reference voltage $V_{10}$ is applied at the reference temperature $T_{10}$ in the second oscillation circuit 61b, and that $f_{11}$ is the output frequency produced when the reference voltage $V_{11}$ is applied at the reference temperature $T_{11}$ in the third oscillation circuit 61c.

When the control voltage $V_{10}$ is inputted to the input end 64b of the second oscillation circuit 61b, the second oscillation circuit 61b oscillates in the form of thickness slip vibration of the basic wave at the oscillation frequency f1 determined by Expression (1) described above based on the temperature T of the second oscillation device X2. When the control voltage $V_{11}$ is inputted to the input end 64c of the third oscillation circuit 61c, the third oscillation circuit 61c oscillates in the form of wave thickness slip vibration of the basic wave at the oscillation frequency f2 determined by Expression (2) described above based on the temperature T of the third oscillation device X3.

The output selection circuit 90 outputs as the frequency f, which is the output signal outputted from the output selection circuit 90, one of the oscillation frequency f2 as the second oscillation signal outputted from the second oscillation circuit 61b and the oscillation frequency f3 as the third oscillation signal outputted from the third oscillation circuit 61c based on the temperature detected with the temperature sensor 93 to the control signal output circuit 63.

The frequency f is inputted to the temperature estimator 68 via the frequency detector 67. The temperature estimator 68 determines the temperature T of the second vibration device X2 or the temperature T of the third vibration device X3 based on the selection made by the output selector of the output selection circuit 90 and estimates the temperature T of the first vibration device X1. The compensation voltage computation section 69 then computes the compensation voltage ΔV based on the temperature T provided by the temperature estimator 68 and applies the control voltage $V_C$ to the first oscillation circuit 61a via the adder 70. The first oscillation circuit 61a vibrates in the form of thickness slip vibration at the frequency that is the first oscillation signal according to the temperature T of the first vibration device X1 and the control voltage $V_C$, that is, the set frequency $f_0$.

That is, at the temperature T, the oscillation frequency of the first oscillation circuit 61a tends to deviate from the set frequency $f_0$ by the difference $(T-T_0)$ from the reference temperature To along the frequency-temperature characteristic of the first oscillation circuit 61a. However, since the control voltage $V_C$, which is lower or higher than the reference voltage $V_0$ by the amount corresponding to the difference described above, is applied to the first oscillation circuit 61a, the output frequency that reflects the cancelation of the difference, that is, the set frequency $f_0$ can be produced.

The oscillator 100 according to the present embodiment can adjust the frequency-temperature characteristic of the second vibration device X2 and the frequency-temperature characteristic of the third vibration device X3 to characteristics suitable for the temperature detection while allowing the frequency-temperature characteristic of the first vibration device X1 to be suitable for the oscillation signal output can therefore quickly and precisely compensate the set frequency $f_0$ outputted from the first vibration device X1 in terms of temperature based on the oscillation frequency f2 of the second vibration device X2 and the oscillation frequency f3 of the third vibration device X3. A high-precision oscillator 100 that oscillates at a stable set frequency $f_0$ can therefore be provided.

Further, under the condition that the frequency-temperature characteristic of the second vibration device X2 and the frequency-temperature characteristic of the third vibration device X3 differ from each other, estimating the temperature T of the first vibration device X1 based on the temperature T of the vibration device having a frequency-temperature characteristic that provides a larger amount of frequency change at the temperature detected with the temperature sensor 93 out of the frequency-temperature characteristic of the second vibration device X2 and the frequency-temperature characteristic of the third vibration device X3 allows more precise estimation of the temperature T of the first vibration device X1. A high-precision oscillator 100 that oscillates at a further stabler set frequency $f_0$ can therefore be provided.

8. Eighth Embodiment

Figure 25:
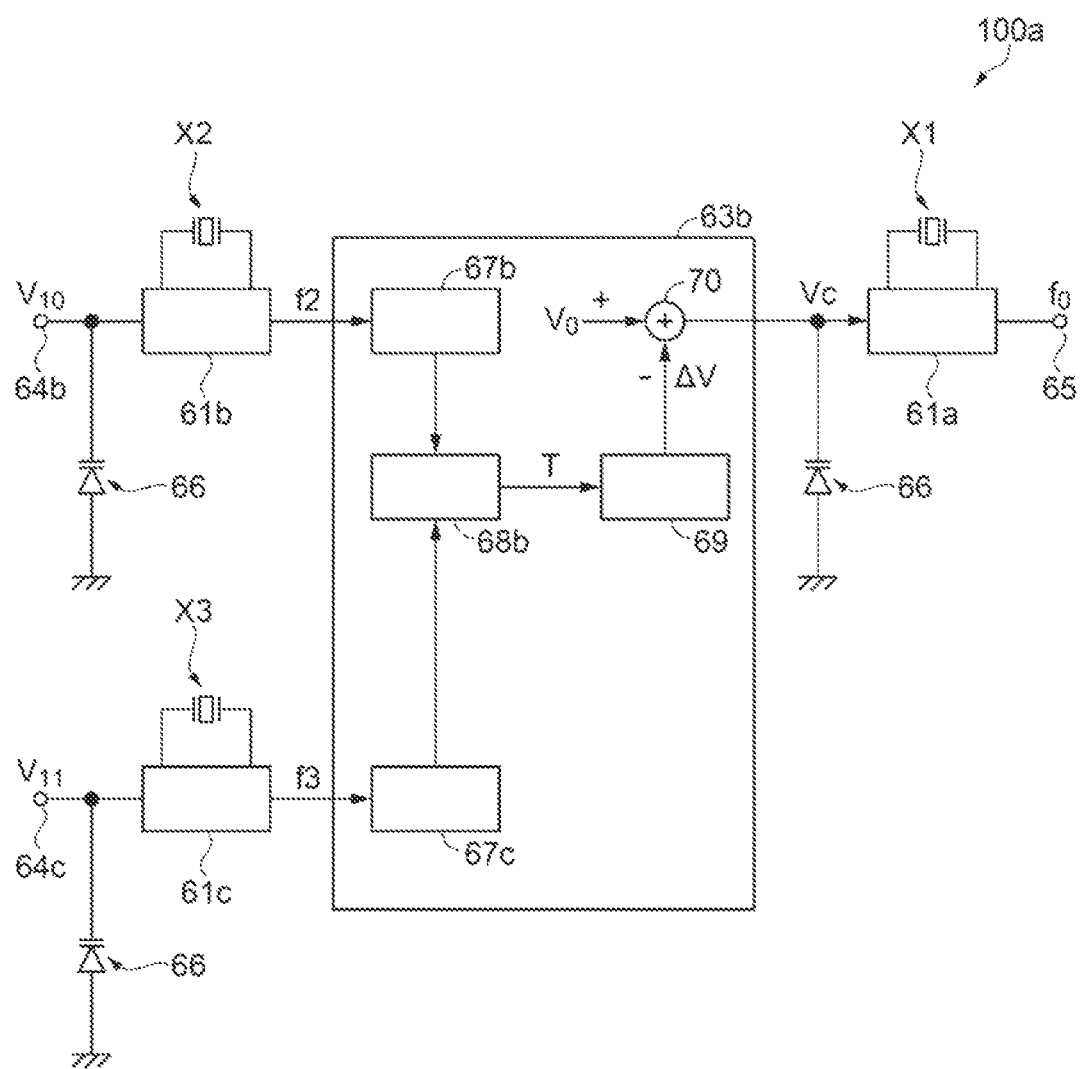
FIG. 25 is a block diagram showing the circuit configuration of the oscillator according to an eighth embodiment.

The circuit configuration of an oscillator 100a according to an eighth embodiment will be described with reference to FIG. 25. The same configurations as those in the seventh embodiment have the same reference characters, and no redundant description of the same configurations will be made.

The eighth embodiment is a form in which the sum of the oscillation frequency f2 of the second vibration device X2 and the oscillation frequency f3 of the third vibration device X3 or the difference therebetween is determined and the thus computed frequency f is used as a temperature detection signal.

A control signal output circuit 63b is provided between the first oscillation circuit 61a and the combination of the second oscillation circuit 61b and the third oscillation circuit 61c, and the control signal output circuit 63b estimates the temperature of the first vibration device X1 based on the oscillation frequency f2 as the second oscillation signal outputted from the second oscillation circuit 61b of the second vibration device X2 and the oscillation frequency f3 as the third oscillation signal outputted from the third oscillation circuit 61c of the third vibration device X3 and computes the control voltage $V_C$ ($V_C=V_0-\Delta V$), which provides the set frequency $f_0$ as the first oscillation signal in the first oscillation circuit 61a at the estimated temperature.

The control signal output circuit 63b includes frequency detectors 67b and 67c, a temperature estimator 68b, the compensation voltage computation section 69, and the adder 70.

The oscillation frequency f2 outputted from the second oscillation circuit 61b is inputted to the temperature estimator 68b via the frequency detector 67b. The oscillation frequency f3 outputted from the third oscillation circuit 61c is inputted to the temperature estimator 68b via the frequency detector 67c.

The temperature estimator 68b computes the difference between the oscillation frequencies f2 and f3 (f2−f3) and estimates the temperature T of the first vibration device X1 based on the computed frequency difference (f2−f3) and data on the relationship between the frequency difference (f2−f3) and the temperature T.

Figure 26:
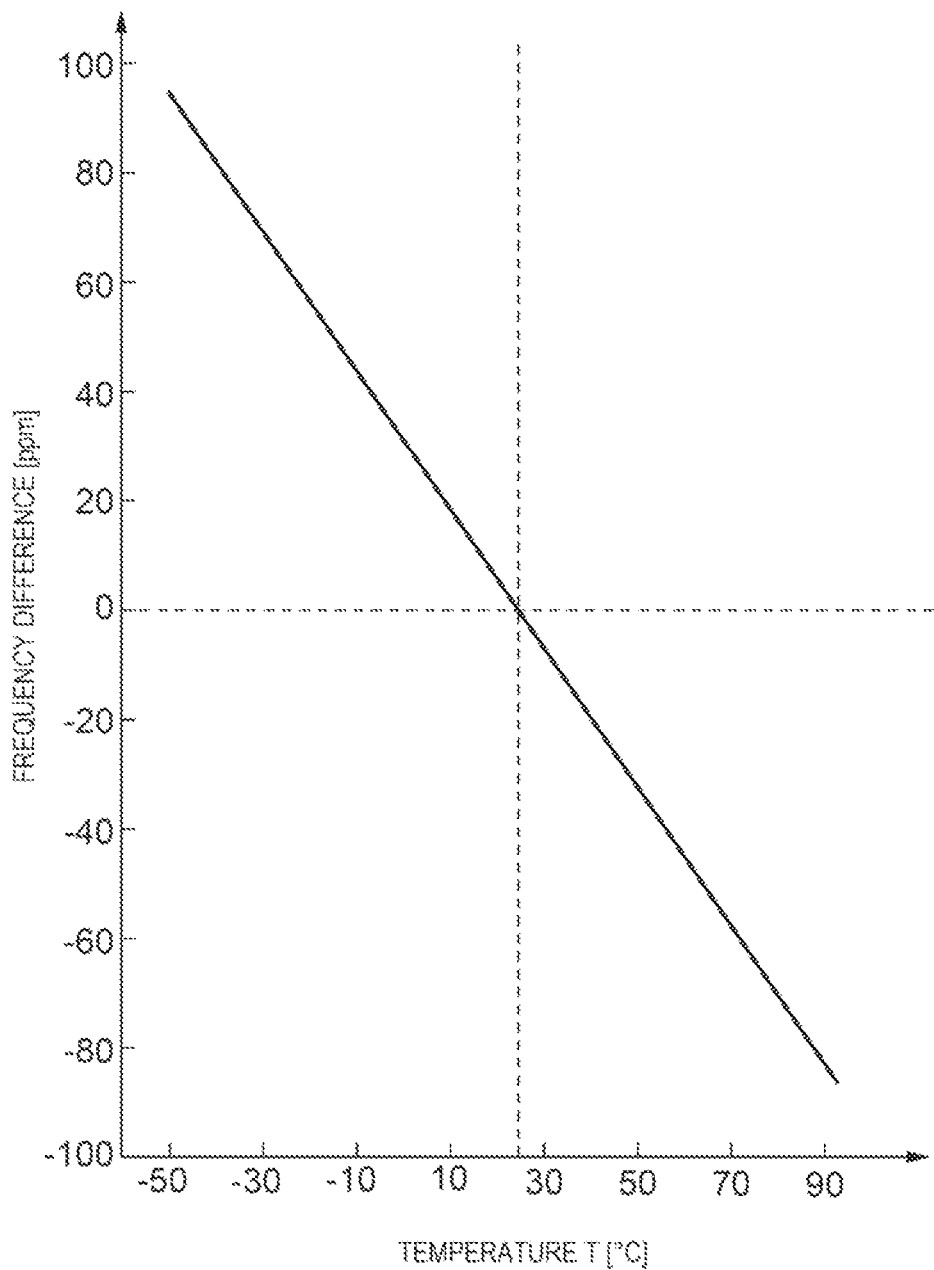
FIG. 26 shows an example of the relationship between the difference in the amount of frequency change between vibration devices and the temperature of another vibration device.

FIG. 26 shows an example of the data on the relationship between the frequency difference (f2−f3) and the temperature T and is the result of subtraction of the cubic curve that is the frequency-temperature characteristic of the third vibration device X3 from the cubic curve that is the frequency-temperature characteristic of the second vibration device X2. The computed frequency difference (f2−f3) is substantially proportional to the temperature T, as seen from FIG. 26.

The temperature estimator 68b includes a storage that stores the data on the relationship between the frequency difference (f2−f3) and the temperature T, a computation section that computes the difference between the oscillation frequencies f2 and f3 (f2−f3), and a reader that reads the temperature T corresponding to the frequency difference (f2−f3) from the relationship data in the storage, which is not shown.

In place of computing the difference between the oscillation frequencies f2 and f3 (f2−f3), the sum of the oscillation frequencies f2 and f3 (f2+f3) may be determined, and the temperature T may be determined by referring to data on the relationship between the sum of the oscillation frequencies (f2+f3) and the temperature T. Still instead, in place of computing the difference between the oscillation frequencies f2 and f3, the difference between V2, which is the result of conversion of the oscillation frequency f2 into voltage, and V3, which is the result of conversion of the oscillation frequency f3 into voltage, may be determined, and the temperature T may be determined by referring to data on the relationship between the voltage difference (V2−V3) and the temperature T.

The oscillator 100a according to the present embodiment can adjust the frequency-temperature characteristic of the second vibration device X2 and the frequency-temperature characteristic of the third vibration device X3 to characteristics suitable for the temperature detection while allowing the frequency-temperature characteristic of the first vibration device X1 to be suitable for the oscillation signal output can therefore quickly and precisely compensate the set frequency $f_0$ outputted from the first vibration device X1 in terms of temperature based on the oscillation frequency f2 of the second vibration device X2 and the oscillation frequency f3 of the third vibration device X3. A high-precision oscillator 100a that oscillates at a stable set frequency $f_0$ can therefore be provided.

Further, under the condition that the frequency-temperature characteristic of the second vibration device X2 and the frequency-temperature characteristic of the third vibration device X3 differ from each other, estimating the temperature T of the first vibration device X1 based on the sum of the oscillation frequency f2 of the second oscillation device X2 and the oscillation frequency f3 of the third vibration device X3 or the difference therebetween allows more precise estimation of the temperature T of the first vibration device X1. A high-precision oscillator 100a that oscillates at a further stabler set frequency $f_0$ can therefore be provided.

What is claimed is:

1. A vibration device comprising:
   a quartz substrate including a first vibration section, a second vibration section, and a third vibration section;
   a pair of first excitation electrodes formed at two principal surfaces of the quartz substrate in the first vibration section;
   a pair of second excitation electrodes so formed in the second vibration section as to sandwich the second vibration section in a thickness direction of the quartz substrate; and
   a pair of third excitation electrodes so formed in the third vibration section as to sandwich the third vibration section in the thickness direction of the quartz substrate,
   wherein at least one of the pair of second excitation electrodes is formed at a first inclining surface that inclines with respect to the two principal surfaces,
   at least one of the pair of third excitation electrodes is formed at a second inclining surface that inclines with respect to the two principal surfaces, and
   the second inclining surface inclines with respect to the first inclining surface.

2. The vibration device according to claim 1,
   wherein the two principal surfaces, the first inclining surface, and the second inclining surface are surfaces cut at different cutting angles.

3. The vibration device according to claim 1,
   wherein the cutting angle of the first inclining surface is greater than the cutting angle of the two principal surfaces, and the cutting angle of the second inclining surface is smaller than the cutting angle of the two principal surfaces.

4. The vibration device according to claim 1,
   wherein the first vibration section, the second vibration section, and the third vibration section have different frequency-temperature characteristics.

5. The vibration device according to claim 4,
   wherein the frequency-temperature characteristic of the second vibration section and the frequency-temperature characteristic of the third vibration section each provide a larger amount of frequency change than the frequency-temperature characteristic of the first vibration section does.

6. The vibration device according to claim 1,
wherein the first and second inclining surfaces incline in such a way that a thickness of the second vibration section and a thickness of the third vibration section decrease as a distance from the first vibration section increases.

7. The vibration device according to claim 1,
wherein the first and second inclining surfaces incline in such a way that the thickness of the second vibration section and the thickness of the third vibration section decrease as a distance to the first vibration section decreases.

8. The vibration device according to claim 1,
wherein the first vibration section has a protrusion formed at at least one of the two principal surfaces.

9. The vibration device according to claim 1,
further comprises a fixing section that fixes the vibration device to a package,
wherein at least one of a through hole and a small-width section is provided between a combination of the first vibration section, the second vibration section, and the third vibration section and the fixing section.

10. The vibration device according to claim 1,
wherein at least one of a through hole and a thin section is provided between at least one of the first vibration section and the second vibration section, and the first vibration section and the third vibration section.

11. An oscillator comprising:
the vibration device according to claim 1;
a first oscillation circuit that is electrically coupled to the first excitation electrodes and outputs a first oscillation signal;
a second oscillation circuit that is electrically coupled to the second excitation electrodes and outputs a second oscillation signal;
a third oscillation circuit that is electrically coupled to the third excitation electrodes and outputs a third oscillation signal; and
a control signal output circuit to which at least one of the second oscillation signal and the third oscillation signal is inputted and which outputs a control signal that controls an oscillation frequency of the first oscillation signal based on the inputted signal.

12. The oscillator according to claim 11, further comprising:
a temperature sensor; and
an output selection circuit to which the second oscillation signal and the third oscillation signal are inputted and which selectively outputs the second oscillation signal or the third oscillation signal based on a result of temperature detection performed by the temperature sensor,
wherein the control signal output circuit outputs the control signal based on an output signal from the output selection circuit.

13. The oscillator according to claim 12,
wherein the output selection circuit selects one of the second oscillation signal and the third oscillation signal that is an oscillation signal having a frequency-temperature characteristic that provides a larger amount of frequency change at a temperature detected with the temperature sensor and outputs the selected oscillation signal.

14. An electronic apparatus comprising the oscillator according to claim 11.

15. A vehicle comprising the oscillator according to claim 11.

* * * * *